US010574929B2

(12) United States Patent
Hwang et al.

(10) Patent No.: US 10,574,929 B2
(45) Date of Patent: Feb. 25, 2020

(54) IMAGE SENSOR SUPPORTING VARIOUS OPERATING MODES AND OPERATING METHOD THEREOF

(71) Applicant: Samsung Electronics Co., Ltd., Suwon-si (KR)

(72) Inventors: Minji Hwang, Seongnam-si (KR); Hyosang Kim, Yongin-si (KR); Haesick Sul, Hwaseong-si (KR); Seung Hyun Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/523,021

(22) Filed: Jul. 26, 2019

(65) Prior Publication Data

US 2019/0349546 A1 Nov. 14, 2019

Related U.S. Application Data

(63) Continuation of application No. 15/252,596, filed on Aug. 31, 2016, now Pat. No. 10,368,023.

(30) Foreign Application Priority Data

Dec. 3, 2015 (KR) .................. 10-2015-0171656

(51) Int. Cl.
*H04N 5/378* (2011.01)
*H04N 9/04* (2006.01)
(Continued)

(52) U.S. Cl.
CPC ....... *H04N 5/378* (2013.01); *H01L 27/14605* (2013.01); *H01L 27/14612* (2013.01);
(Continued)

(58) Field of Classification Search
CPC .. H04N 5/378; H04N 9/04511; H04N 5/3456; H04N 9/045; H04N 5/37457; H04N 5/347; H01L 27/14612; H01L 27/14605
See application file for complete search history.

(56) References Cited

U.S. PATENT DOCUMENTS 7,728,894 B2  6/2010 Chou
7,990,304 B2  8/2011 Lim et al.
(Continued)

FOREIGN PATENT DOCUMENTS

KR  20140067695  6/2014

OTHER PUBLICATIONS

"Image Sensor Supporting Various Operating Modes and Operating Method Thereof" Specification, Drawings and Prosecution History of U.S. Appl. No. 15/252,596, filed Aug. 31, 2016, by Minji Hwang, et al.

*Primary Examiner* — Mekonnen D Dagnew
(74) *Attorney, Agent, or Firm* — Onello & Mello, LLP

(57) ABSTRACT

Disclosed is an image sensor. The image sensor includes an active pixel sensor array including first to fourth pixel units sequentially arranged in a column direction, and each of the first to fourth pixel units is composed of a plurality of pixels. A first pixel group including the first and second pixel units is connected to a first column line, and a second pixel group including the third pixel unit and the fourth pixel unit is connected to a second column line. The image sensor includes a correlated double sampling circuit including first and second correlated double samplers and configured to convert a first sense voltage sensed from a selected pixel of the first pixel group and a second sense voltage sensed from a selected pixel of the second pixel group into a first correlated double sampling signal and a second correlated double sampling signal, respectively.

20 Claims, 28 Drawing Sheets

(51) Int. Cl.
    *H04N 5/3745*    (2011.01)
    *H04N 5/345*     (2011.01)
    *H01L 27/146*    (2006.01)
    *H04N 5/347*     (2011.01)

(52) U.S. Cl.
    CPC .......... *H04N 5/347* (2013.01); *H04N 5/3456* (2013.01); *H04N 5/37457* (2013.01); *H04N 9/045* (2013.01); *H04N 9/04511* (2018.08)

(56) References Cited

U.S. PATENT DOCUMENTS

| | | |
|---|---|---|
| 8,237,808 B2 | 8/2012 | Matsumoto et al. |
| 8,350,939 B2 | 1/2013 | Yin et al. |
| 8,809,759 B2 | 8/2014 | Mo et al. |
| 9,001,251 B2 | 4/2015 | Smith et al. |
| 2008/0079832 A1 | 4/2008 | Chou |
| 2008/0170137 A1 | 7/2008 | Matsumoto et al. |
| 2008/0308852 A1* | 12/2008 | Lee ................ H01L 27/14643 257/292 |
| 2010/0207798 A1 | 8/2010 | Lim et al. |
| 2013/0182165 A1 | 7/2013 | Kimura |
| 2013/0313411 A1 | 11/2013 | Ui |
| 2014/0145067 A1 | 5/2014 | Suh et al. |
| 2014/0263964 A1 | 9/2014 | Yang et al. |
| 2015/0029375 A1 | 1/2015 | Sugawa et al. |
| 2015/0116565 A1* | 4/2015 | Kim ................ H04N 5/37457 348/308 |
| 2018/0359443 A1* | 12/2018 | Cho .................... H04N 5/378 |

* cited by examiner

FIG. 20

IMAGE SENSOR SUPPORTING VARIOUS OPERATING MODES AND OPERATING METHOD THEREOF

CROSS-REFERENCE TO RELATED APPLICATIONS

The present application is a continuation application of U.S. patent application Ser. No. 15/252,596, filed on Aug. 31, 2016, which claims under 35 U.S.C. § 119 priority and the benefit of Korean Patent Application No. 10-2015-0171656 filed Dec. 3, 2015, in the Korean Intellectual Property Office, the entire contents of which are hereby incorporated by reference.

BACKGROUND

Inventive concepts described herein relate to an image sensor, and more particularly, relate to an image sensor supporting various operating modes that make it possible to improve the performance of an analog-to-digital converter (ADC).

The use of a mobile device such as a smartphone, a tablet personal computer (PC), a digital camera, an MP3 player, or an e-book reader continues to increase. To photograph an image, at least one image sensor is mounted on most mobile devices. Image sensors may be implemented, for example, as a charge coupled device (CCD) image sensor or a complementary metal-oxide semiconductor (CMOS) image sensor, for example.

Compared with a CMOS image sensor, a CCD image sensor has a low noise and an excellent image quality. However, a CMOS image sensor provides for simple and varied scanning and operation. Additionally, a signal processing circuit may be integrated in a single chip with a CMOS image sensor, thereby enabling miniaturization of a product. And, because a CMOS image sensor is compatible with CMOS process technology, the unit cost of production is reduced. Because of low power consumption, a CMOS image sensor is easily applied to a mobile device.

As the resolution of pixels constituting an image sensor increases and as an image sensor is miniaturized, a shared type of pixel array in which a plurality of transmission transistors share the same floating diffusion (FD) area is widely used. In the case of an image sensor using the shared type of pixel array, one analog digital converter generally processes a sense voltage outputted from pixels connected to one column. However, due to a structural feature that a floating diffusion area is shared therewith, all analog digital converters are not used while processing an image and this reduces the operating speed of an image sensor. Accordingly, it is important to improve the operating speed of an image sensor using a shared type of pixel array in which a plurality of transmission transistors shares the same floating diffusion area.

SUMMARY

Example embodiments in accordance with principles of inventive concepts provide a method of reducing the operating speed of an analog digital converter while the operating speed of an image sensor is maintained by effectively arranging pixels included in an image sensor and column line connected to the pixels.

According example embodiments in accordance with principles of inventive concepts, an image sensor includes an active pixel sensor array including first to fourth pixel units sequentially arranged in a column direction, and each of the first to fourth pixel units includes a plurality of pixels, and a first pixel group including the first and second pixel units is connected to a first column line, and a second pixel group including the third and fourth pixel units is connected to a second column line and a correlated double sampling circuit including first and second correlated double samplers and configured to convert a first sense voltage sensed from a selected pixel of the first pixel group and a second sense voltage sensed from a selected pixel of the second pixel group into a first correlated double sampling signal and a second correlated double sampling signal, respectively. The first sense voltage is converted into the first correlated double sampling signal by one of the first and second correlated double samplers, and the second sense voltage is converted into the second correlated double sampling signal by the other of the first and second correlated double samplers.

According to another example embodiment in accordance with principles of inventive concepts, an image sensor includes an active pixel sensor array including first to tenth pixel units sequentially arranged in a column direction, each of the first to tenth pixel units includes a plurality of pixels, a first pixel group including the first, second, and seventh to tenth pixel units is connected to a first column line, and a second pixel group including the third to sixth pixel units is connected to a second column line, a row decoder configured to select a row of the active pixel sensor array under control of a timing controller, a correlated double sampling circuit including first and second correlated double samplers and configured to convert a first sense voltage sensed from a selected pixel of the first pixel group and a second sense voltage sensed from a selected pixel of the second pixel group into a first correlated double sampling signal and a second correlated double sampling signal, respectively, and a multiplexer configured to connect the first column line to one of the first and second correlated double samplers and to connect the second column line to the other of the first and second correlated double samplers under control of the timing controller. The first sense voltage is converted into the first correlated double sampling signal by one of the first and second correlated double samplers, and the second sense voltage is converted into the second correlated double sampling signal by the other of the first and second correlated double samplers.

According to still another example embodiment of the inventive concept, an image sensor includes an active pixel sensor array including first to fourth pixel units sequentially arranged in a column direction and fifth to eighth pixel units sequentially arranged in a column, which is adjacent to the first to fourth pixel units, in a column direction, and each of the first to eighth pixel units includes a plurality of pixels, and a first pixel group including the first and second pixel units is connected to a first column line, and a second pixel group including the third and fourth pixel units is connected to a second column line, and a third pixel group including the fifth and sixth pixel units is connected to a third column line, and a fourth pixel group including the seventh and eighth pixel units is connected to a fourth column line and a correlated double sampling circuit including first and fourth correlated double samplers and configured to convert a first sense voltage sensed from a selected pixel of the first pixel group and a second sense voltage sensed from a selected pixel of the second pixel group into a first correlated double sampling signal and a second correlated double sampling signal, respectively and to convert a third sense voltage sensed from a selected pixel of the third pixel group and a fourth sense voltage sensed from a selected pixel of the fourth pixel group into a third correlated double sampling signal and a fourth correlated double sampling signal, respectively. The first sense voltage is converted into the first correlated double sampling signal by one of the first and second correlated double samplers. The second sense voltage is converted into the second correlated double sampling signal by the other of the first and second correlated double samplers. The third sense voltage is converted into the third correlated double sampling signal by one of the third and fourth correlated double samplers. The fourth sense voltage is converted into the fourth correlated double sampling signal by the other of the third and fourth correlated double samplers.

In an example embodiment an image sensor includes an array of pixel units arranged in columns and rows, each pixel unit including a plurality of pixels sharing a floating diffusion region, and each pixel associated with a characteristic light range sensitivity; a plurality of correlated double-sampling circuits configured to perform correlated double sampling on photo signals generated by the pixels, wherein the correlated double samplers are configured to perform correlated double sampling in parallel on signals from a plurality of pixels of the same characteristic light range sensitivity from different pixel units within a column of pixel units; and a plurality of analog-to-digital converters configured to convert correlated double-sampled signals from different pixel units within a column of pixel units in parallel.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 20 is a conceptual diagram illustrating an active pixel sensor array driven according to an embodiment described in FIG. 19;

DETAILED DESCRIPTION

Below, example embodiments of inventive concepts will now be described more fully so that those skilled in the art can easily comprehend the inventive concepts.

Figure 1:
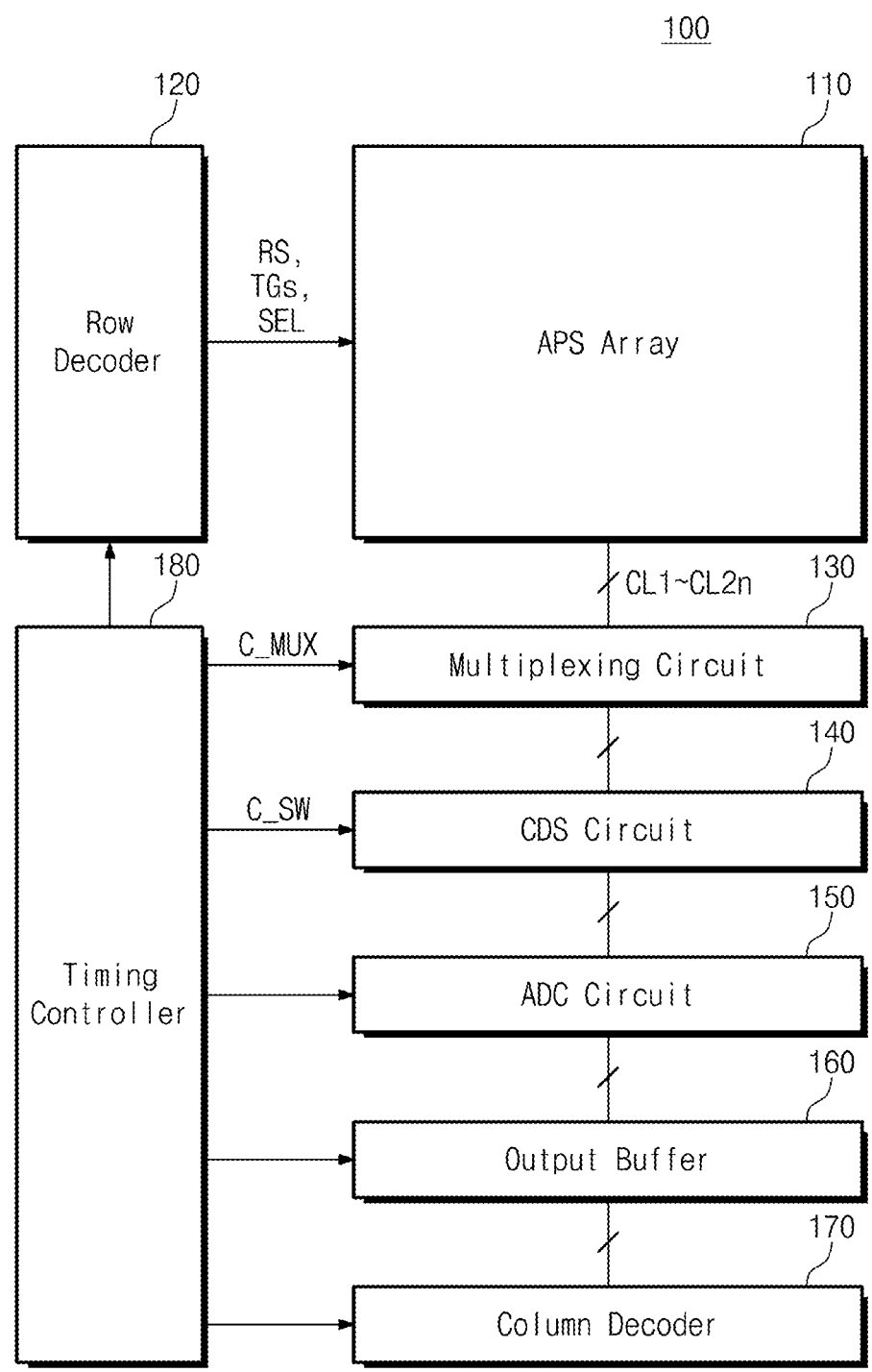
FIG. 1 is a block diagram illustrating an image sensor according to an embodiment of the inventive concept.

FIG. 1 is a block diagram illustrating an example embodiment of an image sensor 100 in accordance with principles of inventive concepts. Referring to FIG. 1, the image sensor 100 may include an active pixel sensor (APS) array 110, a row decoder 120, a multiplexing circuit 130, a correlated double sampling circuit 140, an analog-to-digital converting circuit 150, an output buffer 160, a column decoder 170, and a timing controller 180.

The active pixel sensor array 110 may include a plurality of pixels arranged in rows and columns. The active pixel sensor array 110 may include pixel units each of which shares the same floating diffusion (FD) area as one another. That is, pixels in a pixel unit may share a floating diffusion area, or region. In an example embodiment, one pixel unit is composed of four pixels all of which share the same floating diffusion area, but inventive concepts are not limited thereto. In other example embodiments different numbers of pixels may be included in a pixel unit, all of which share a floating diffusion area; one pixel unit may include eight pixels, all of which share the same floating diffusion area, for example. According to an embodiment of the inventive concept, pixel units connected to one multiplexer may be divided into two groups so as to be connected to two column lines different from each other. The detailed structure of the active pixel sensor array 110 will be described in the discussion related to FIG. 2.

Each of the pixels constituting the active pixel sensor array 110 may convert a light signal into an electrical signal. Pixels connected to a row selected by a selection signal SEL may be driven by a reset signal RS and transmission signals TGs. In example embodiments the transmission signals TGs may include a plurality of transmission signals (e.g., TG1 to TG4), each for driving a plurality of pixels constituting a pixel unit (PXU). As a result, the electrical signal sensed at each pixel connected to the selected row may be transmitted to the correlated double sampling circuit 140 through a plurality of column lines CL1 to CL2n.

The row decoder 120 may select any row of the active pixel sensor array 110 under control of the timing controller 180. To select a, the row decoder 120 may generate the selection signal SEL. The row decoder 120 may transmit the reset signal RS and the transmission signals TGs to pixels corresponding to the selected row. In response, analog reference and an image signals generated from active pixel sensors of the selected row may be transmitted to the correlated double sampler 140.

The multiplexing circuit 130 may select a plurality of column line CL1 to CL2n. For example, the multiplexing circuit 130 may include a plurality of multiplexers, and two column lines may be connected to one multiplexer and a plurality of pixel units may be connected to each column line. The multiplexing circuit 130 may control the two column lines so as to be respectively connected to different correlated double samplers from each other based on a control signal C_SW received from the timing controller 180. However, according to another embodiment of the inventive concept, the multiplexing circuit 130 may be omitted. In this case, inputs Vout1 and Vout2 may be directly and simultaneously input to correlated double samplers CDS1 and CDS2, respectively. As a result, a sampling operation may be simultaneously performed with respect to pixels of two groups connected to one multiplexer, thereby improving the operating speed of an image sensor. The description thereof will be described in greater detail in the discussion related to FIG. 4.

The correlated double sampling circuit 140 may sequentially sample and hold a set of reference signal (REF) and an image signal (IMG) provided from the active pixel sensor array 110 to each of a plurality of column lines CL1 to CL2n. That is, the correlated double sampling circuit 130 may sample and hold the level of the reference signal REF and the image signal IMG corresponding to each column. The correlated double sampling circuit 130 may transmit, to the analog-to-digital converting circuit 150, the set of the reference signal (REF) and/or the image signal (IMG) of each of the columns sampled according to control of the timing controller 180 by a plurality of column units. The correlated double sampling circuit 140 may include a plurality of correlated double samplers. In example embodiments, two correlated double samplers may be connected to one multiplexer.

The analog-to-digital converting circuit 150 may convert a correlated double sampling signal (e.g., the reference signal (REF) and/or the image signal (IMG)), which is outputted from the correlated double sampling circuit 130, related to each column into a digital signal and may output the digital signal.

The output buffer 160 may latch and output image data from each column unit, which is provided from the analog-to-digital converting circuit 150. The output buffer 160 may temporarily store image data outputted from the analog-to-digital converting circuit 150 under control of the timing controller 180 and may output the image data sequentially latched by the column decoder 170.

The column decoder 170 may select the column of the output buffer 160 under control of the timing controller 180. The output buffer 160 may sequentially output image data stored by a column unit based on the selection of the column decoder 160.

Above, a configuration of the image sensor 100 according to an example embodiment in accordance with principles of inventive concepts is briefly described. In particular, two column lines and two correlated double samplers may be connected to each multiplexer constituting the multiplexing circuit 1300, and pixels of two groups may be respectively connected to two column lines. Moreover, the timing controller 180 may control a multiplexer such that pixels of two different groups are respectively connected to two different correlated double samplers. As a result, two analog digital converters respectively connected to two correlated double samplers may simultaneously perform a converting operation in parallel, thereby improving the operating speed of the image sensor 100.

Figure 2:
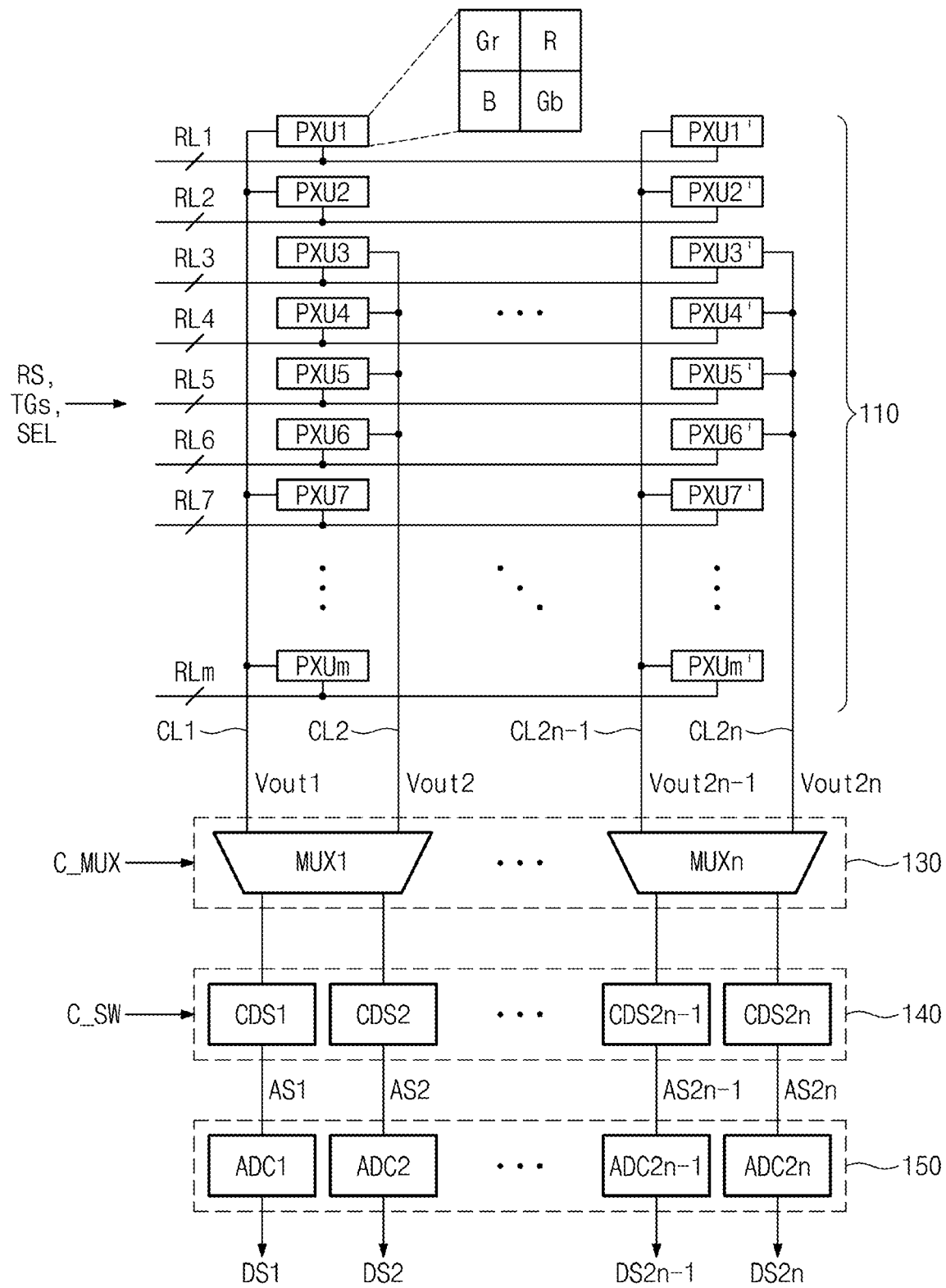
FIG. 2 is a block diagram illustrating an active pixel sensor array illustrated in FIG. 1.

FIG. 2 is a block diagram illustrating in greater detail an example embodiment of an active pixel sensor array 110 in accordance with principles of inventive concepts. Referring to FIG. 2, the active pixel sensor array 110 may include a plurality of pixels arranged in a plurality of rows and a plurality of columns. Each pixel unit (PXU) may include four pixels and may be defined as a group of pixels sharing the same floating diffusion area (FD) with one another. A pixel unit (PXU) may be connected to two column lines (e.g., CL1 and CL2) and one row line (i.e., one of RL1 to RLm). For example, the reset signal RS, the transmission signals TGs, and the selection signal SEL may be inputted through a row line RL1 connected to the pixel unit (PXU). The detailed structure of an example embodiment of the pixel unit PXU will be described in the discussion related to FIG. 3.

A pixel unit (PXU) may include a pixel R including a red filter, pixels Gr and Gb, each of which includes a green filter, and a pixel B including a blue filter. The pixel Gr may be a pixel that is adjacent to the pixel R in a row direction, and the pixel Gb may be a pixel that is adjacent to the pixel B in a row direction. The red filter may allow light of a red wavelength bandwidth to pass, the green filter may pass light of a green wavelength bandwidth, and the blue filter may pass light of a blue wavelength bandwidth. Each pixel may include a plurality of transistors and a photoelectric conversion device. Each pixel may detect a light using a photoelectric conversion device, may convert the light into an electrical signal, and may output the electrical signal through column lines CL1 to CL2n.

When the reset signal RS and the transmission signals TGs are inputted to a row selected in response to the selection signal SEL, sense voltages Vout1 to Vout2n corresponding to the reset signal RS and the transmission signals TGs may be outputted to each of the column lines CL1 to CL2n of the selected row.

According to an embodiment of the inventive concept, pixel units (PXUs) arranged between two columns adjacent to each other may be connected to two different column lines. For example, referring to FIG. 2, pixel units PXU1, PXU2, PXU7, ..., etc. among pixel units PXU1 to PXUm that are arranged on the leftmost side may be connected to the first column line CL1. Pixel units PXU3 to PXU6, etc. may be connected to the second column line CL2. That is, the pixel units PXU1 and PXU2 respectively connected to the first and second row lines RL1 and RL2 may be connected to the first column line CL1 and pixel units PXU3 to PXUm may be alternately connected to the second column line CL2 and the first column line CL1 by four pixel units connected to four row lines. Even though the pixel unit PXUm is illustrated as being connected to the first column line CL1 in FIG. 2, the pixel unit PXUm may be connected to the second column line CL2 based on the number of rows (e.g., m).

The multiplexing circuit 130 may include a plurality of multiplexers, MUX1 to MUXn. As illustrated in FIG. 2, two column lines may be connected to each multiplexer. The multiplexer may allow sense voltages (e.g., Vout1 and Vout2) outputted from each column line to be respectively connected to different correlated double samplers (e.g., CDS1 and CDS2) based on a control signal C_MUX from the timing controller 180 (refer to FIG. 1). As a result, the sense voltages (e.g., Vout1 and Vout2) outputted from the different column lines (e.g., CL1 and CL2) may be simultaneously processed.

The correlated double sampling circuit 140 may include a plurality of correlated double samplers CDS1 to CDS2n. As illustrated in FIG. 2, two correlated double samplers may be connected to a column line by one multiplexer. Each correlated double sampler may sample the sense voltages Vout1 to Vout2n provided from a multiplexer as each of the reference signal REF and the image signal IMG.

The analog-to-digital converting circuit 150 may include a plurality of analog-to-digital converters ADC1 to ADC2n. The plurality of analog-to-digital converters ADC1 to ADC2n may respectively correspond to the plurality of correlated double samplers, and the analog-to-digital converters ADC1 to ADC2n may respectively convert analog signals AS1 to AS2n, each of which is received from a corresponding correlated double sampler, into digital signals DS1 to DS2n.

Figure 3:
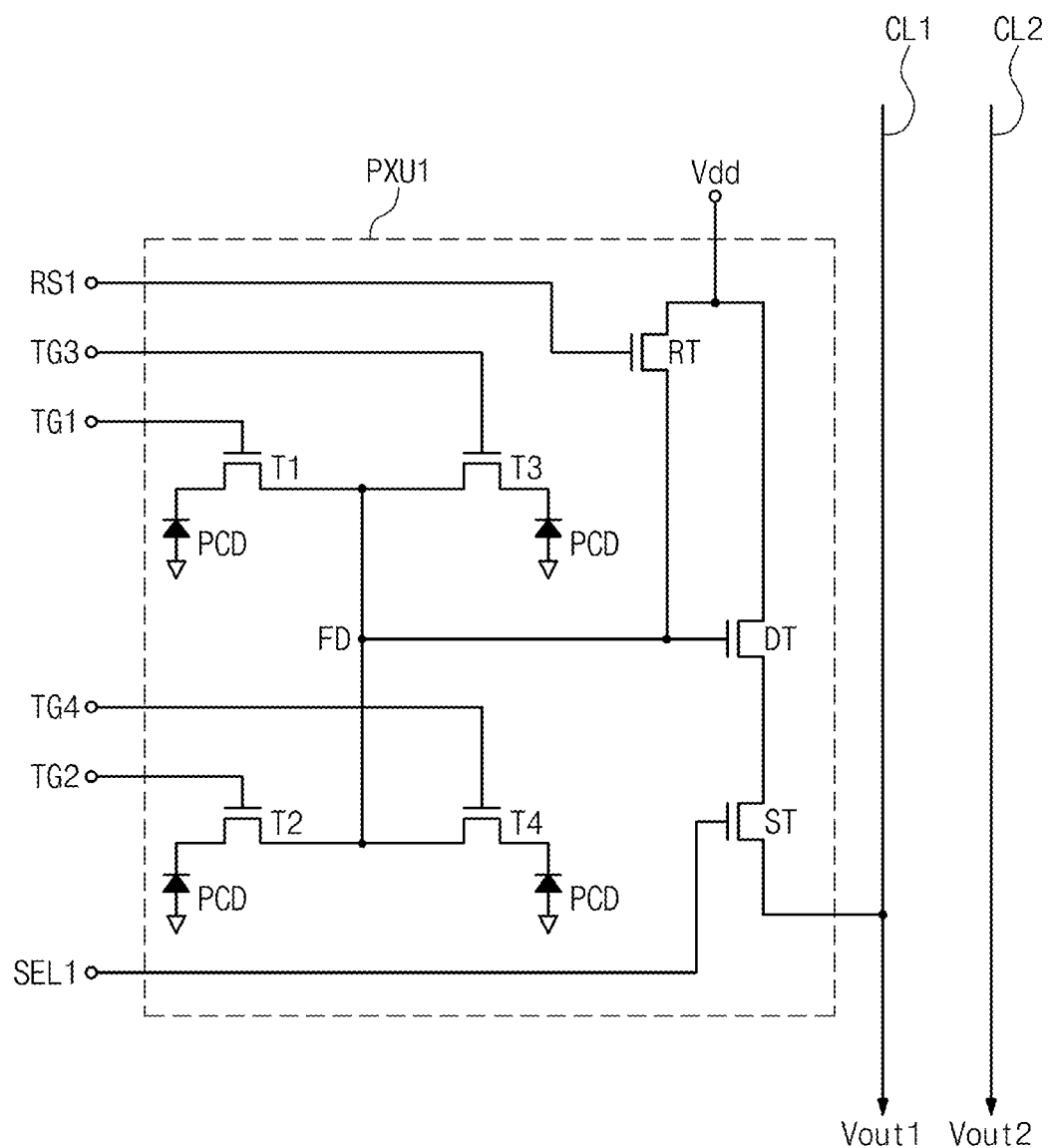
FIG. 3 is a circuit diagram illustrating a pixel unit illustrated in FIG. 2.

FIG. 3 is a circuit diagram illustrating an example embodiment of a pixel unit PXU1 in accordance with principles of inventive concepts. Referring to FIG. 3, a pixel unit PXU1 may include four photoelectric conversion devices (PCDs), four transmission transistors T1 to T4, a reset transistor RT, a drive transistor DT, and a select transistor ST. The transmission transistor T1, the reset transistor RT, the drive transistor DT, and the select transistor ST may constitute the pixel Gr of FIG. 2, the transmission transistor T2, the reset transistor RT, the drive transistor DT, and the select transistor ST may constitute the pixel B of FIG. 2, the transmission transistor T3, the reset transistor RT, the drive transistor DT, and the select transistor ST may constitute the pixel R of FIG. 2, and, the transmission transistor T4, the reset transistor RT, the drive transistor DT, and the select transistor ST may constitute the pixel Gb of FIG. 2, for example.

Each photoelectric conversion device PCD may be a light sensing device for generating and accumulating a charge based on an amount, or intensity, of incident light. The photoelectric conversion device PCD may be implemented with a photo diode, a photo transistor, a photo gate, a pinned photo diode (PPD), and the like.

The transmission transistors T1 to T4 may transmit a charge accumulated by the photoelectric conversion devices PCDs onto the floating diffusion area FD. As illustrated in FIG. 3, the transmission transistors T1 to T4 may share the floating diffusion area FD. That is, the output of each of the transmission transistors T1 to T4 may be connected to one node. Each of the transmission transistors T1 to T4 may be turned on or off in response to each of the transmission signals TG1 to TG4 provided from the row decoder 120 (refer to FIG. 1).

The floating diffusion area FD may function to detect a charge corresponding to an amount of incident light. A charge provided from a photoelectric conversion device PCD may be accumulated in the floating diffusion area FD during a time when each of the transmission signals TG1 to TG4 is activated. For example, each of the transmission signals TG1 to TG4 may be sequentially activated, and thus the transmission transistors T1 to T4 may be sequentially turned on, and charge sequentially accumulated and read out for each PCD. The floating diffusion area FD may be connected to the gate terminal of the drive transistor DT, operating as a source follower amplifier to read out charge accumulated in the floating diffusion area FD. The floating diffusion area FD may receive a power supply voltage Vdd by the reset transistor RT.

The reset transistor RT may reset the floating diffusion area FD in response to a reset signal RS1. The source terminal of the reset transistor RT may be connected to the floating diffusion area FD, and the drain terminal thereof may be connected to a power supply voltage Vdd terminal. When the reset transistor RT is turned-on in response to the reset signal RS1, the power supply voltage Vdd connected with the drain terminal of the reset transistor RT may be transmitted to the floating diffusion area FD and the charge accumulated at the floating diffusion area FD may move to the power supply voltage Vdd terminal, and the voltage of the floating diffusion area FD may sequentially provide a reset and photo-signal The drive transistor DT may be turned-on/off according to an electrical potential of the floating diffusion area FD. For example, if the reset transistor RT is turned-on by the reset signal RS1, the drive transistor DT is turned-off, and floating diffusion area FD is reset as Vdd. That is, a first analogue signal corresponding to the reset signal RS1 is outputted through column line CL1. On the other hand, if the reset transistor RT is turned-off by the reset signal RS1 and the first transmission transistor T1 is turned-on by the first transmission signal TG1, a charge provided from the photoelectric conversion device PCD may be accumulated in the floating diffusion area FD. As a result, the drive transistor DT is turned-on and a second analogue signal corresponding to the charge is outputted through column line CL1. The pixel unit PXU1 is illustrated as being connected to the first column line CL1; other pixel units (e.g., PXU3 to PXU6, etc.) may be connected to the second column line CL2 in this example embodiment, as previously described.

The select transistor ST may select a pixel to be read by a row unit. The select transistor ST may be driven in response to the selection signal SEL1 provided by a row unit. When the select transistor ST is turned on, the potential of the floating diffusion area FD may be amplified and transmitted to the drain terminal of the select transistor ST through the drive transistor DT.

According to the described example embodiment, one pixel unit is described as including four photoelectric conversion devices (i.e., four pixels). However, embodiments of inventive concepts may not be limited thereto. For example, one pixel unit may include eight pixels. In such embodiments, because the structure is the same except that eight transmission transistors share one floating diffusion area, a detailed description thereof will not be repeated here.

Figure 4:
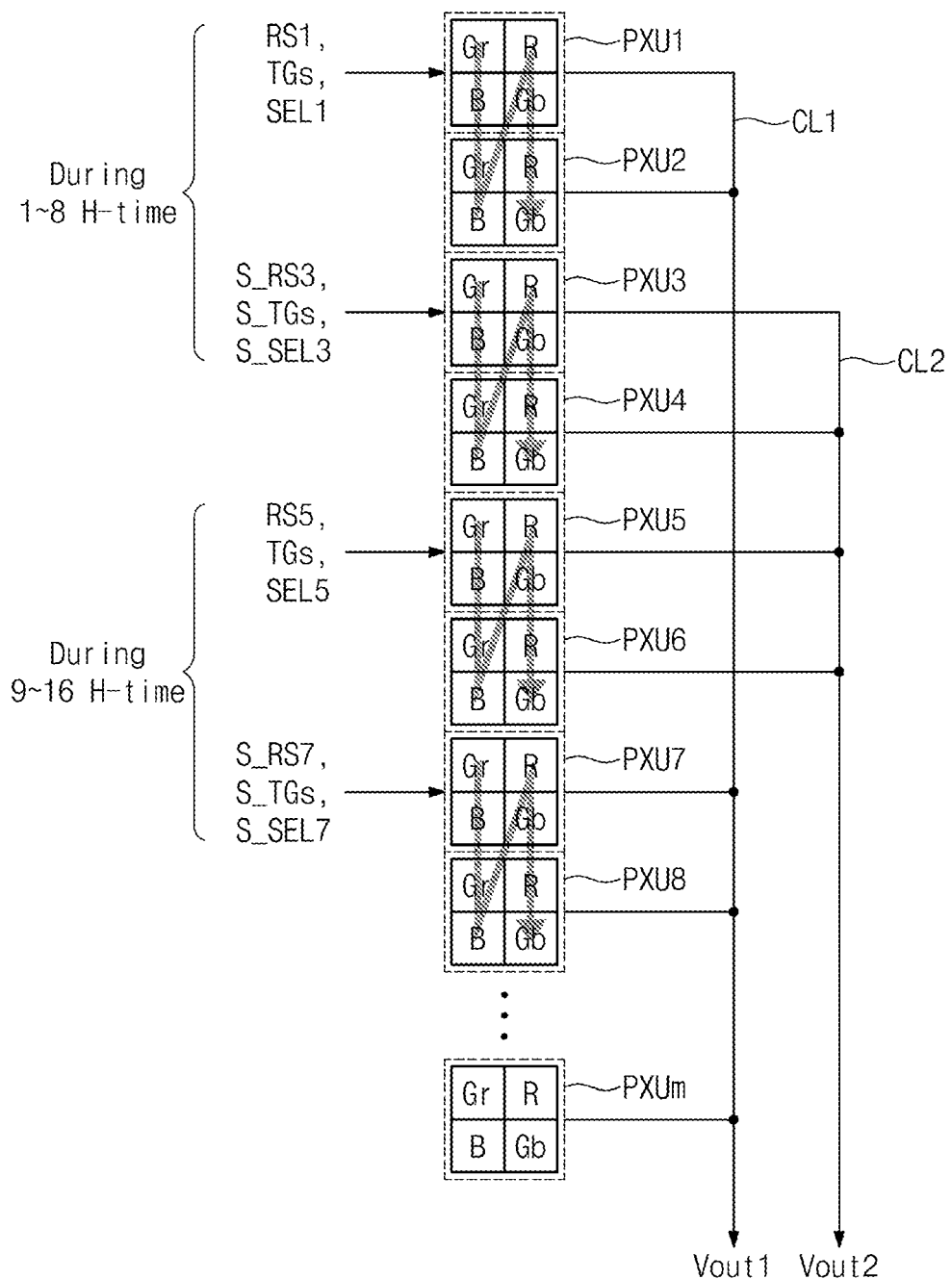
FIG. 4 is a conceptual diagram illustrating an operating method of an image sensor according to an embodiment of the inventive concept.

FIG. 4 is a conceptual diagram for illustrating an operating method of an image sensor according to an example embodiment in accordance with principles of inventive concepts. In FIG. 4, a full mode of operation will be described below. The full mode may refer to performing a sampling and holding operation and an analog-to-digital converting operation with respect to a voltage sensed by all pixels constituting the active pixel sensor array 110 (refer to FIG. 2). For example, the pixel units PXU1 to PXUm connected to the multiplexer MUX1 of FIG. 2 is described below.

In an example embodiment, the first pixel unit PXU1 connected to the first row line and the second pixel unit PXU2 connected to the second row line may be connected to the first column line CL1. Subsequent pixel units PXU3 to PXUm may be alternately connected to different column lines (alternating CL1 and CL2, for example) by four-pixel units. That is, for example, the third pixel unit PXU3 connected to the third row line, the fourth pixel unit PXU4 connected to the fourth row line, the fifth pixel unit PXU5 connected to the fifth row line, and the sixth pixel unit PXU6 connected to the sixth row line may be connected to the second column line CL2; the seventh pixel unit PXU7 connected to the seventh row line, the eighth pixel unit PXU8 connected to the eighth row line, the ninth pixel unit PXU9 connected to the ninth row line, and the tenth pixel unit PXU10 connected to the tenth row line may be connected to the first column line CL1, and so on.

In operation, from 1 Horizontal time (H-time) to 8 H-time, sensing operations by the first and second pixel unit PXU1 and PXU2 connected to the first column line CL1 and sensing operations by the third and fourth pixel unit PXU3 and PXU4 connected to the second column line CL2 may be performed at the same timing. That is, for example, a sensing operation at the pixel Gr of the first pixel unit PXU1 and a sensing operation at the pixel Gr of the third pixel unit PXU3 may occur simultaneously in a first horizontal time period; sensing of the pixel B of the first pixel unit PXU1 and of the pixel B of the third pixel unit PXU3 may occur simultaneously during a second horizontal time period; sensing of the pixel Gr of the second pixel unit PXU2 and of the pixel Gr of the fourth pixel unit PXU4, may occur simultaneously during a third horizontal time period; sensing of the pixel B of the second pixel unit PXU2 and of the pixel B of the fourth pixel unit PXU4, may occur simultaneously during a fourth horizontal time period; sensing of the pixel R of the first pixel unit PXU1 and of the pixel R of the third pixel unit PXU3, may occur simultaneously during a fifth horizontal time period; and so on.

In more detail, when the selection signal SEL1 is applied to select the first pixel unit PXU1, a selection signal S_SEL3 for selecting the third pixel unit PXU3 may be applied simultaneously. When the reset signal RS1 is applied to drive the reset transistor RT (refer to FIG. 2) of the first pixel unit PXU1, a reset signal S_RS3 may be applied to simultaneously drive the reset transistor of the third pixel unit PXU3. When the transmission signals TGs for driving the transmission transistors T1 to T4 of the first pixel unit PXU1 are applied, the transmission signals TGs for driving the transmission transistors T1 to T4 of the third pixel unit PXU3 may be applied simultaneously. An "S", which is illustrated in FIG. 4, attached in front of names of signals applied to the third pixel unit PXU3 may be to give a meaning of "being performed at the same time" (or, simultaneously) as the corresponding signals applied to first pixel unit PXU1.

When sensing operations by the first to fourth pixel units PXU1 to PXU4 are completed according to the simultaneous read operation, sensing operations by the fifth to eighth pixel units PXU5 to PXU8 may be performed from 9 H-time to 16 H-time in a manner corresponding to that just described in relation to pixel units PXU1 through PXU4. During each H-time, or period, specific control signals inputted to pixels are illustrated in, and will be described in greater detail in the discussion related to FIGS. 5 to 12.

Figure 5:
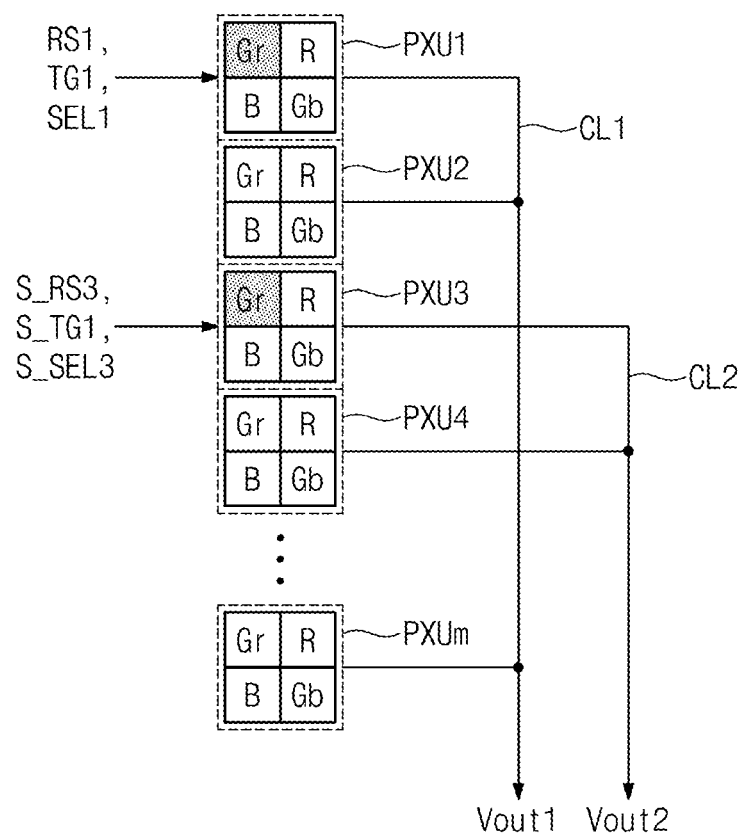
FIGS. 5 to 12 are block diagrams illustrating embodiments illustrated in FIG. 4 by H-time.

Referring to FIG. 5, the selection signal SEL1, the reset signal RS1 and the first transmission signal TG1 may be applied to the first pixel unit PXU1 during 1 H-time (also referred to herein as a first horizontal time period). The first transmission signal TG1 may be a signal for driving the pixel Gr (e.g., the first transmission transistor T1 of FIG. 2) constituting the first pixel unit PXU1. At the same time, the selection signal S_SEL3, the reset signal S_RS3, and a first transmission signal S_TG1 may be applied to the third pixel unit PXU3. The first transmission signal S_TG1 may be a signal for driving the pixel Gr (e.g., the first transmission transistor T1 of FIG. 2) constituting the third pixel unit PXU3. The voltage Vout1 sensed by the pixel Gr of the first pixel unit PXU1 may be outputted through the first column line CL1, and the voltage Vout2 sensed by the pixel Gr of the third pixel unit PXU3 may be outputted through the second column line CL2. Because the sense voltages Vout1 and Vout2 are simultaneously outputted by the pixel units PXU1 and PXU2 respectively connected to the column lines CL1 and CL2, the sense voltages Vout1 and Vout2 may be simultaneously processed by the correlated double samplers CDS1 and CDS2 (refer to FIG. 2), respectively.

Figure 6:
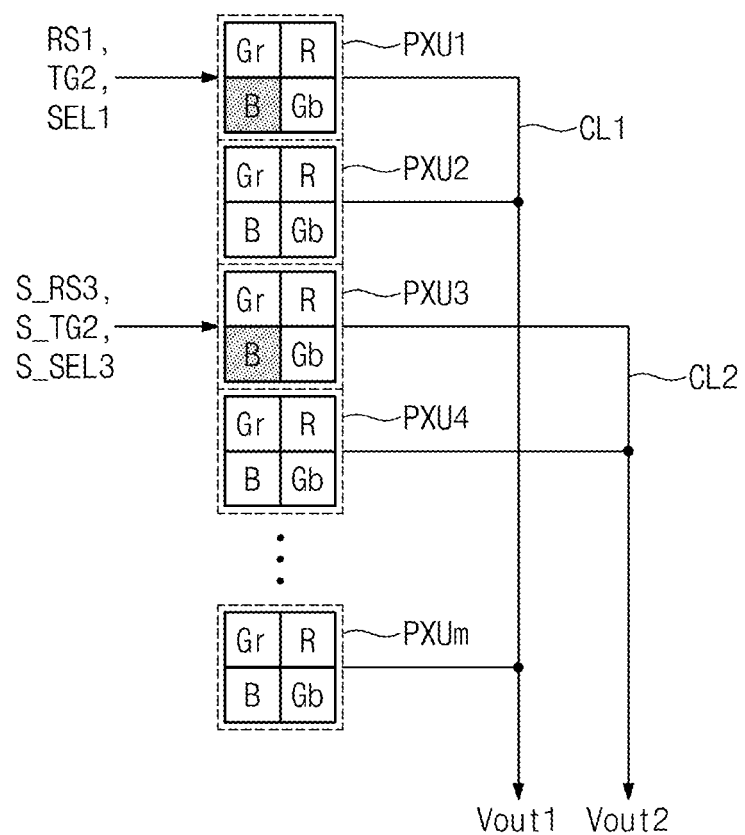

Referring to FIG. 6, the selection signal SEL1, the reset signal RS1 and the second transmission signal T2 may be applied to the first pixel unit PXU1 during 2 H-time (also referred to herein as the second horizontal time period). The second transmission signal TG2 may be a signal for driving the pixel B (e.g., the second transmission transistor T2 of FIG. 2) constituting the first pixel unit PXU1. At the same time, the selection signal S_SEL3, the reset signal S_RS3, and a second transmission signal S_TG2 may be applied to the third pixel unit PXU3. The second transmission signal S_TG2 may be a signal for driving the pixel B (e.g., the second transmission transistor T2 of FIG. 2) constituting the third pixel unit PXU3.

The voltage Vout1 sensed by the pixel B of the first pixel unit PXU1 may be outputted through the first column line CL1, and the voltage Vout2 sensed by the pixel B of the third pixel unit PXU3 may be outputted through the second column line CL2.

Figure 7:
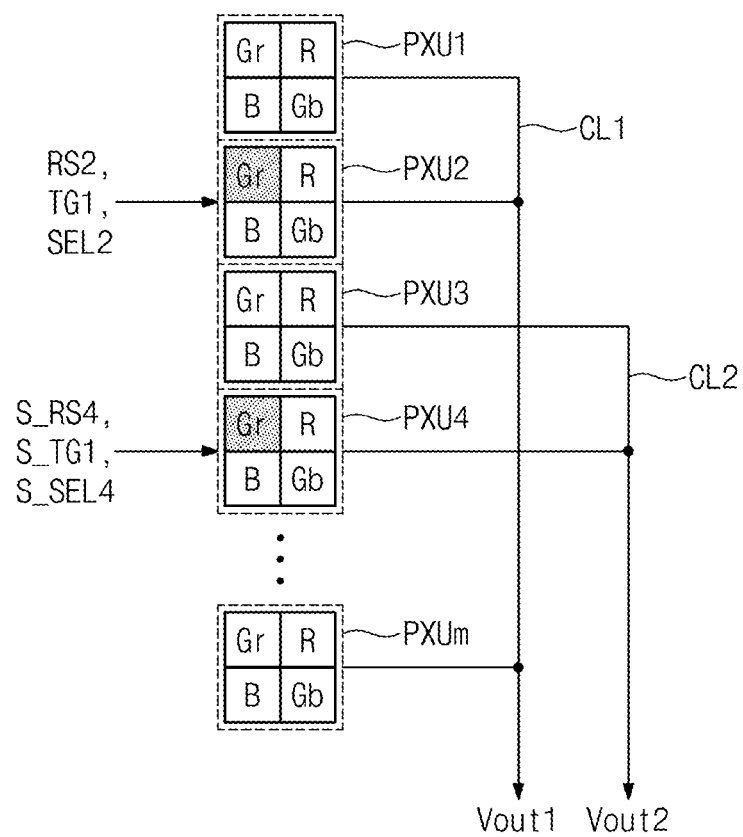

Referring to FIG. 7, a selection signal SEL2, a reset signal RS2, and the first transmission signal TG1 may be applied to the second pixel unit PXU2 during 3 H-time (also referred to herein as the third horizontal time period). The first transmission signal TG1 may be a signal for driving the pixel Gr (e.g., the first transmission transistor T1 of FIG. 2) constituting the second pixel unit PXU2. At the same time, a selection signal S_SEL4, a reset signal S_RS4, and the first transmission signal S_TG1 may be applied to the fourth pixel unit PXU4. The first transmission signal S_TG1 may be a signal for driving the pixel Gr (e.g., the first transmission transistor T1 of FIG. 2) constituting the fourth pixel unit PXU4.

The voltage Vout1 sensed by the pixel Gr of the second pixel unit PXU2 may be outputted through the first column line CL1, and the voltage Vout2 sensed by the pixel Gr of the fourth pixel unit PXU4 may be outputted through the second column line CL2.

Figure 8:
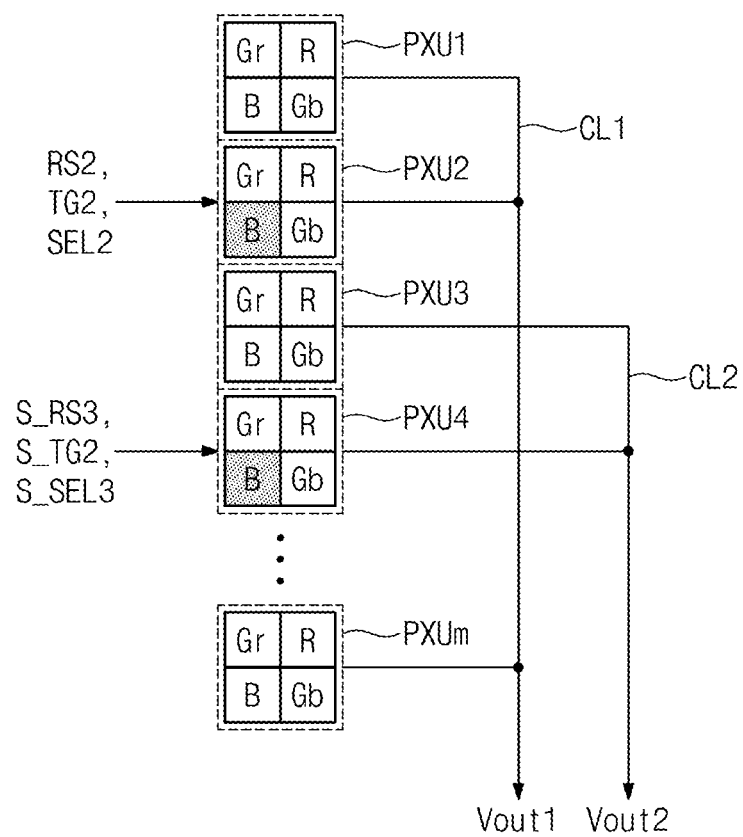

Referring to FIG. 8, the selection signal SEL2, the reset signal RS2 and the second transmission signal TG2 may be applied to the second pixel unit PXU2 during 4 H-time (also referred to herein as the fourth horizontal time period). The second transmission signal TG2 may be a signal for driving the pixel B (e.g., the second transmission transistor T2 of FIG. 2) constituting the second pixel unit PXU2. At the same time, the selection signal S_SEL4, the reset signal S_RS4, and the second transmission signal S_TG2 may be applied to the fourth pixel unit PXU4. The second transmission signal S_TG2 may be a signal for driving the pixel B (e.g., the second transmission transistor T2 of FIG. 2) constituting the fourth pixel unit PXU4.

The voltage Vout1 sensed by the pixel B of the second pixel unit PXU2 may be outputted through the first column line CL1, and the voltage Vout2 sensed by the pixel B of the fourth pixel unit PXU4 may be outputted through the second column line CL2.

Figure 9:
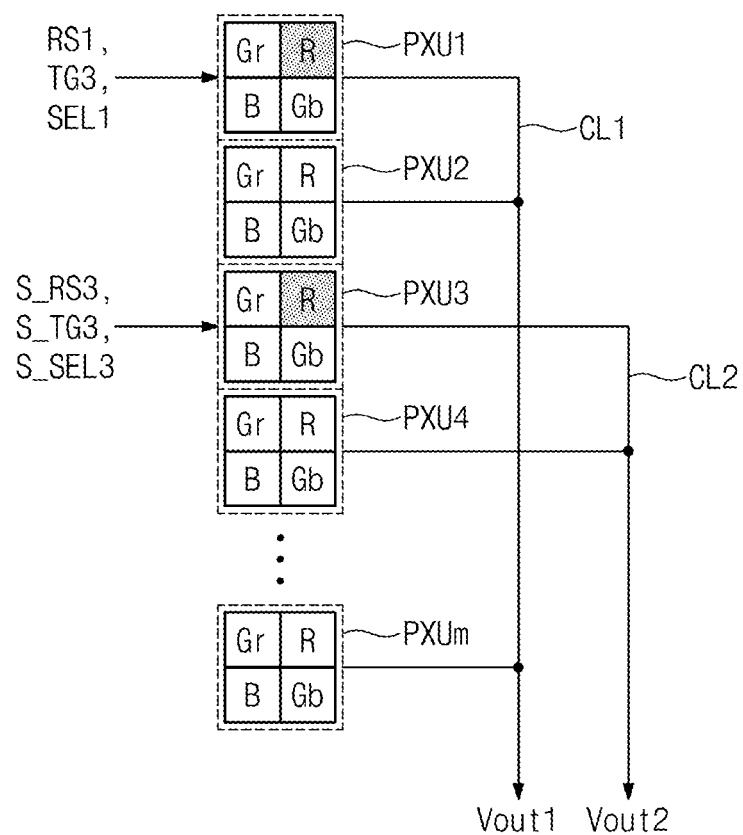

Referring to FIG. 9, the selection signal SEL1, the reset signal RS1 and the third transmission signal TG3 may be applied to the first pixel unit PXU1 during 5 H-time (also referred to herein as the fifth horizontal time period). The third transmission signal TG3 may be a signal for driving the pixel R (e.g., the third transmission transistor T3 of FIG. 2) constituting the first pixel unit PXU1. At the same time, the selection signal S_SEL4, the reset signal S_RS4, and a third transmission signal S_TG3 may be applied to the fourth pixel unit PXU4. The third transmission signal S_TG3 may be a signal for driving the pixel R (e.g., the third transmission transistor T3 of FIG. 2) constituting the third pixel unit PXU3.

The voltage Vout1 sensed by the pixel R of the first pixel unit PXU1 may be outputted through the first column line CL1, and the voltage Vout2 sensed by the pixel R of the third pixel unit PXU3 may be outputted through the second column line CL2.

Figure 10:
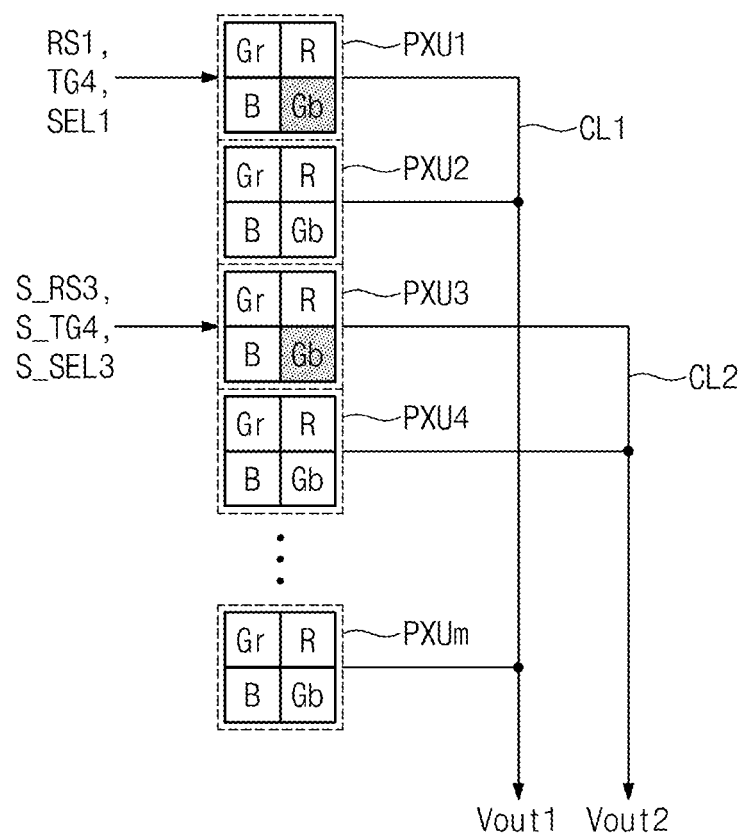

Referring to FIG. 10, the selection signal SEL1, the reset signal RS1, and the fourth transmission signal TG4 may be applied to the first pixel unit PXU1 during 6 H-time (also referred to herein as the sixth horizontal time period). The fourth transmission signal TG4 may be a signal for driving the pixel Gb (e.g., the fourth transmission transistor T4 of FIG. 2) constituting the first pixel unit PXU1. At the same time, the selection signal S_SEL4, the reset signal S_RS4, and a fourth transmission signal S_TG4 may be applied to the third pixel unit PXU3. The fourth transmission signal S_TG4 may be a signal for driving the pixel Gb (e.g., the fourth transmission transistor T4 of FIG. 2) constituting the third pixel unit PXU3.

The voltage Vout1 sensed by the pixel Gb of the first pixel unit PXU1 may be outputted through the first column line CL1, and the voltage Vout2 sensed by the pixel Gb of the third pixel unit PXU3 may be outputted through the second column line CL2.

Figure 11:
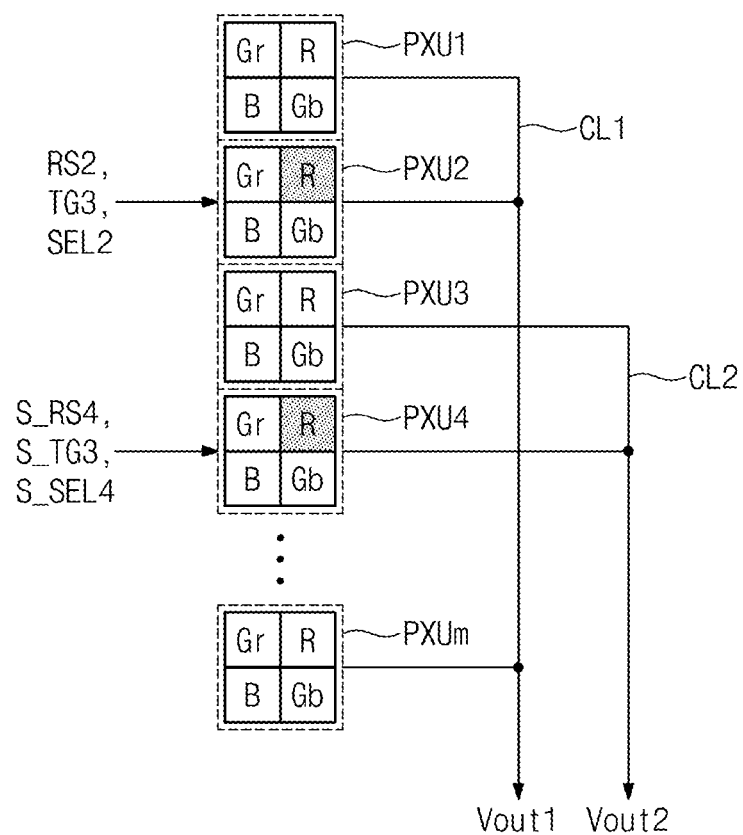

Referring to FIG. 11, the selection signal SEL2, the reset signal RS2, and the third transmission signal TG3 may be applied to the second pixel unit PXU2 during 7 H-time (also referred to herein as the seventh horizontal time period). The third transmission signal TG3 may be a signal for driving the pixel R (e.g., the third transmission transistor T3 of FIG. 2) constituting the second pixel unit PXU2. At the same time, the selection signal S_SEL4, the reset signal S_RS4, and the third transmission signal S_TG3 may be applied to the fourth pixel unit PXU4. The third transmission signal S_TG3 may be a signal for driving the pixel R (e.g., the third transmission transistor T3 of FIG. 2) constituting the fourth pixel unit PXU4.

The voltage Vout1 sensed by the pixel R of the second pixel unit PXU2 may be outputted through the first column line CL1, and the voltage Vout2 sensed by the pixel R of the fourth pixel unit PXU4 may be outputted through the second column line CL2.

Figure 12:
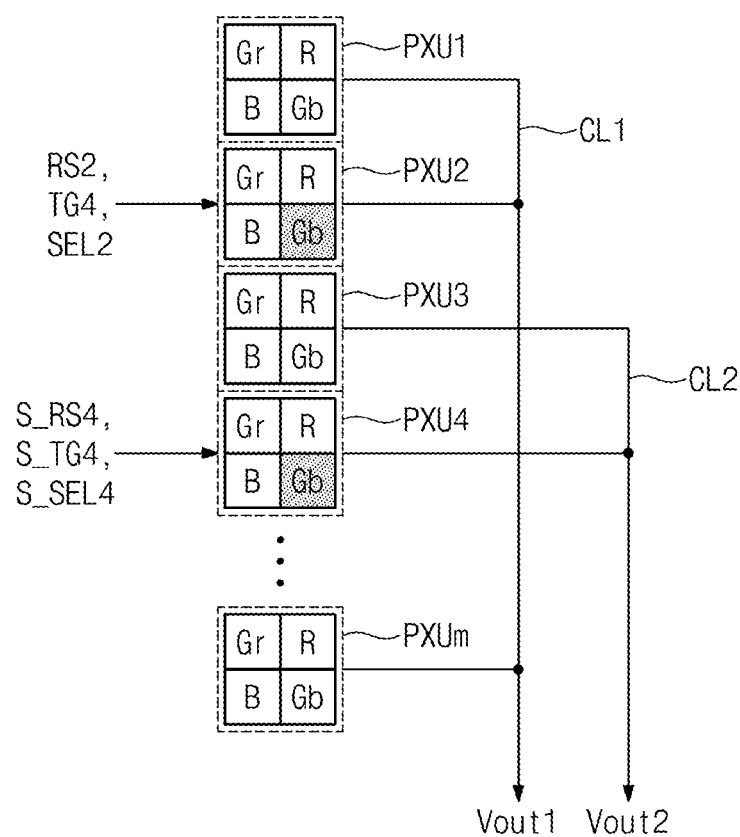

Finally, referring to FIG. 12, the selection signal SEL2, the reset signal RS2, and the fourth transmission signal TG4 may be applied to the second pixel unit PXU2 during 8 H-time (also referred to herein as the eighth horizontal time period). The fourth transmission signal TG4 may be a signal for driving the pixel Gb (e.g., the fourth transmission transistor T4 of FIG. 2) constituting the second pixel unit PXU2. At the same time, the selection signal S_SEL4, the reset signal S_RS4, and the fourth transmission signal S_TG4 may be applied to the fourth pixel unit PXU4. The fourth transmission signal S_TG4 may be a signal for driving the pixel Gb (e.g., the fourth transmission transistor T4 of FIG. 2) constituting the fourth pixel unit PXU4.

The voltage Vout1 sensed by the pixel Gb of the second pixel unit PXU2 may be outputted through the first column line CL1, and the voltage Vout2 sensed by the pixel Gb of the fourth pixel unit PXU4 may be outputted through the second column line CL2.

As described in FIGS. 5 to 12, a sensing operation may be simultaneously performed with respect to the pixel units (PXUs) respectively connected to different column lines, thereby reducing processing time by the correlated double sampling circuit 140 (refer to FIG. 2), and the analog digital converting circuit 150. Moreover, during the procedure, the multiplexing circuit 130 (refer to FIG. 2) may allow the sense voltages Vou1 to Vout2n to be respectively processed by different correlated double samplers (and different analog digital converters).

Figure 13:
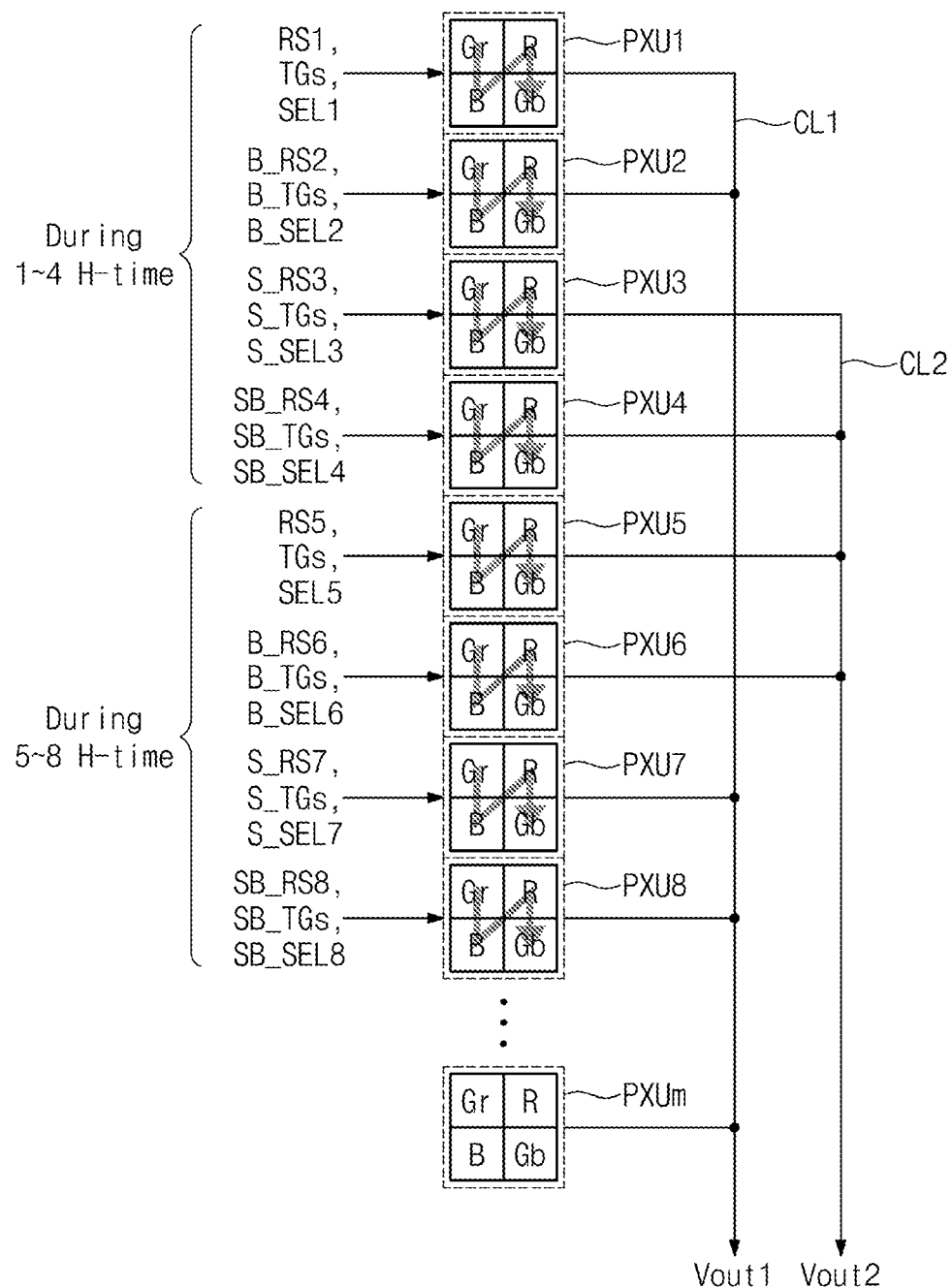
FIG. 13 is a block diagram illustrating an operating method of an image sensor according to an embodiment of the inventive concept.

FIG. 13 is a block diagram illustrating an operating method of an image sensor according to another example embodiment in accordance with principles of inventive concepts in which a different pattern of simultaneous read-outs are employed. FIGS. 14 to 17 are block diagrams illustrating embodiments illustrated in FIG. 13 by H-time, or horizontal time period.

In an example embodiment, a binning mode will be described below. Unlike the above-described full mode, associated with FIGS. 4-12, the binning mode may refer to a mode in which a value (or mean value) obtained by summing output values of the same type of pixels is outputted as a sense voltage. According to an embodiment of the inventive concept, 2-binning mode in which a value (or mean value) obtained by summing outputs of the same type of two pixels is outputted as a sense voltage will be described. For example, the pixel units PXU1 to PXUm connected to the multiplexer MUX1 of FIG. 2 is described below. The transmission signals TGs illustrated in FIG. 13 may include the transmission signals TG1 to TG4 for driving four pixels included in one pixel unit (PXU).

Figure 14:
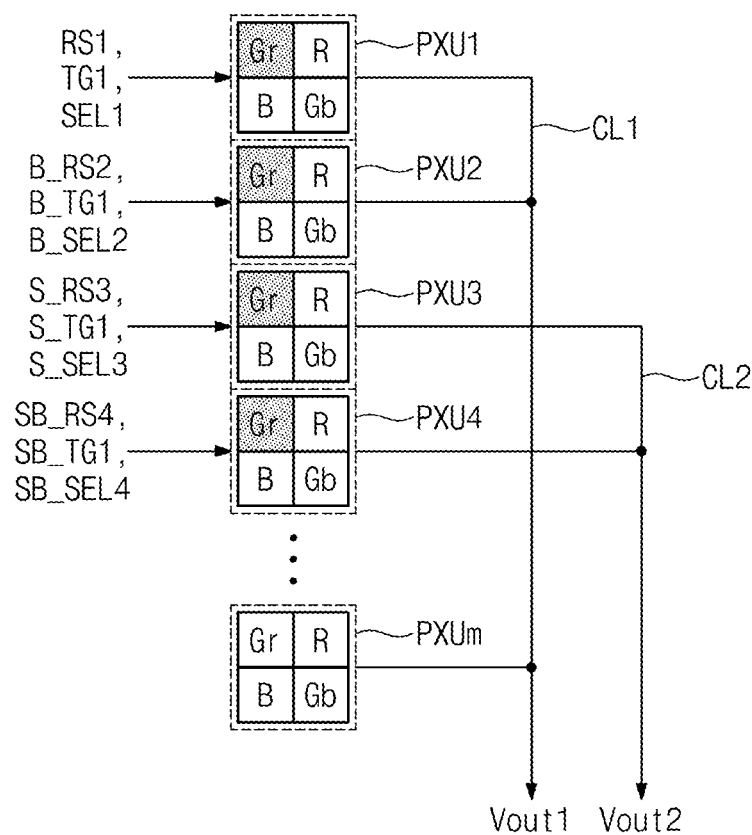
FIGS. 14 to 17 are block diagrams illustrating embodiments illustrated in FIG. 13 by H-time.
Figure 15:
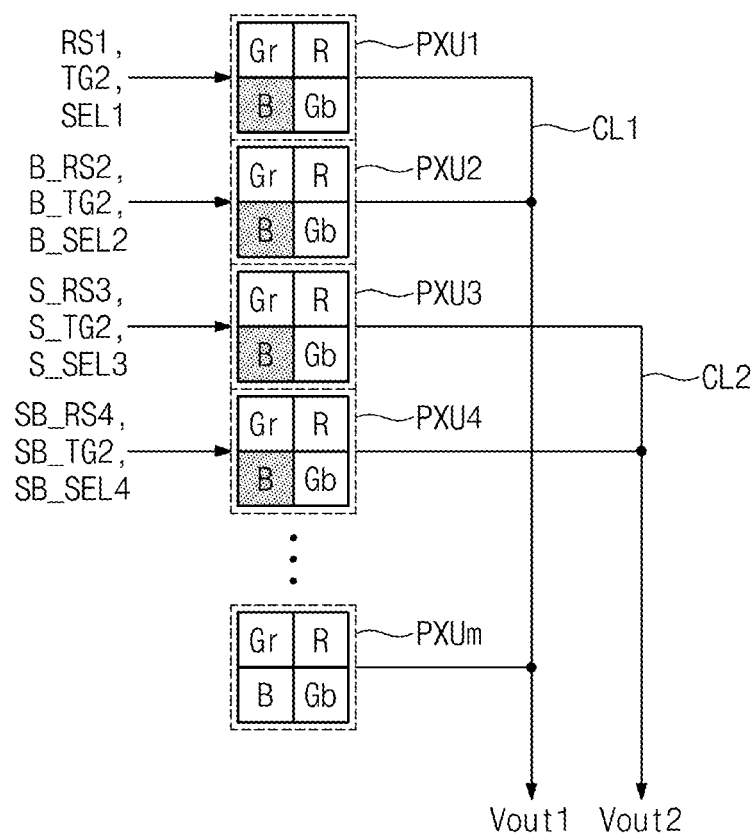
Figure 16:
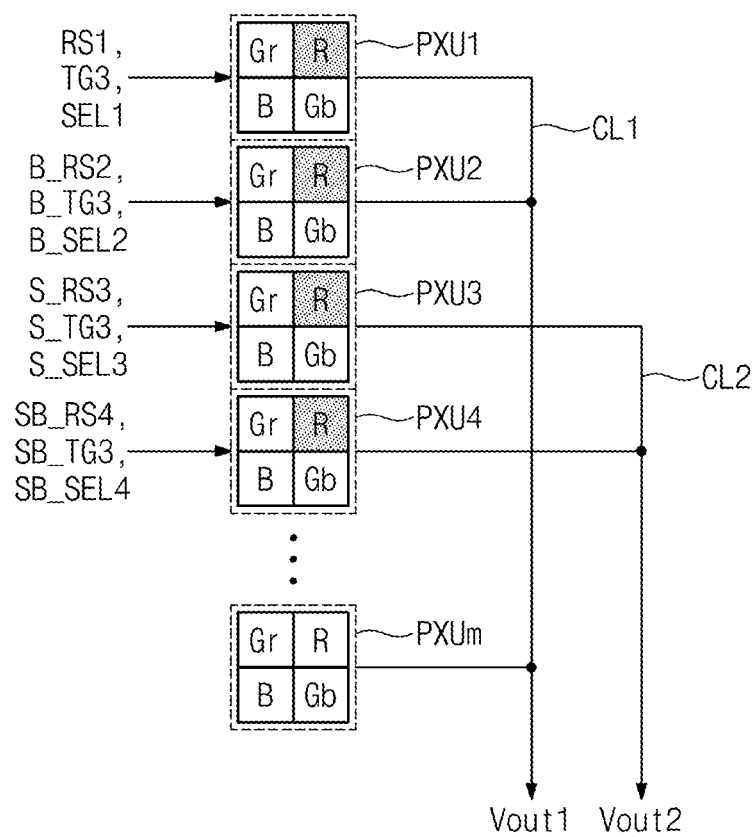
Figure 17:
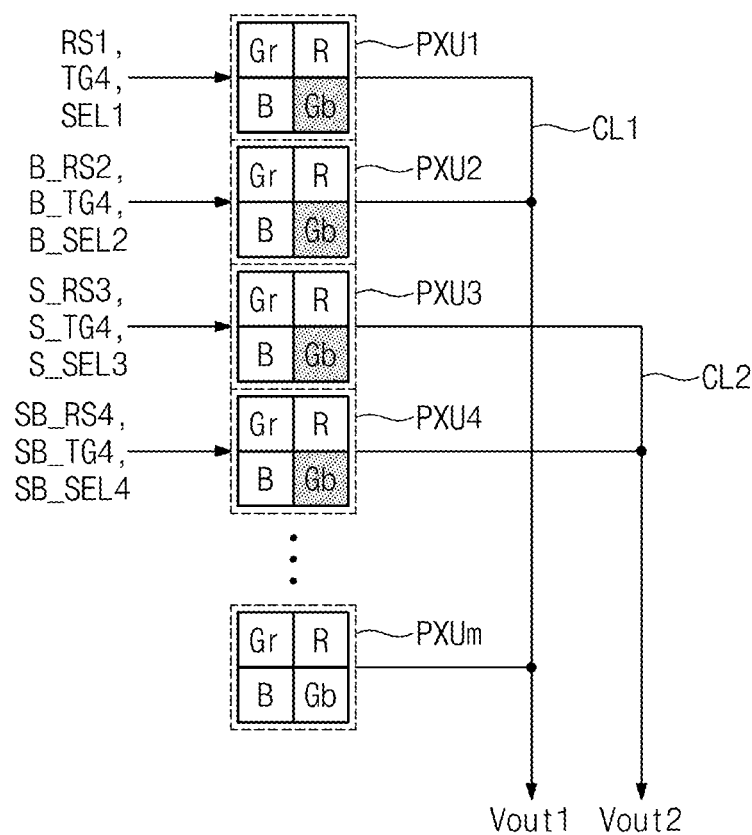

Referring to FIGS. 13 and 14, during 1 H-time, a sensing operation by the pixels Gr of the first to fourth pixel units PXU1 to PXU4 may be performed.

To perform a sensing operation by the pixel Gr of the first pixel unit PXU1, the reset signal RS1, the selection signal SEL1 and the transmission signal TG1 may be inputted to the first pixel unit PXU1. At the same time, to perform a sensing operation by the pixel Gr of the first pixel unit PXU1, a reset signal B_RS2, a selection signal B_SEL2 and a transmission signal B_TG1 may be inputted to the second pixel unit PXU2. The voltage Vout1 sensed by the first and second pixel units PXU1 and PXU2 may be simultaneously outputted to the first column line CL1.

Moreover, to perform a sensing operation by the pixel Gr of the third pixel unit PXU3, the reset signal S_RS3, the selection signal S_SEL3, and the transmission signal S_TG1 may be inputted to the third pixel unit PXU3. At the same time, to perform a sensing operation by the pixel Gr of the fourth pixel unit PXU4, the reset signal S_RS3, the selection signal S_SEL3, and the transmission signal S_TG1 may be inputted to the fourth pixel unit PXU4. The voltage Vout2 sensed by the third and fourth pixel units PXU3 and PXU4 may be simultaneously outputted to the second column line CL2.

That is, a binning operation in which a value (or mean value) obtained by summing voltages sensed by the first and second pixel units PXU1 and PXU2 is outputted may be performed, and a binning operation in which a value (or mean value) obtained by summing voltages sensed by the third and fourth pixel units PXU3 and PXU4 is outputted may be performed. Of course, in order to obtain a mean value by perform binning operation, meaning circuit or averaging circuit (not shown), configured to receive sense voltages Vout1 and Vout2 and to calculate the mean value, may be further provided. Moreover, sensing operations may be simultaneously performed by the first and second pixel units PXU1 and PXU2 and the third and fourth pixel units PXU3 and PXU4.

Afterwards, from 2 H-time to 4 H-time (also referred to herein as from horizontal time period 2H though horizontal time period 4H), a sensing operation similar to the sensing operation of the pixel Gr may be performed with respect to other pixels B, R, and Gb of each of the first to fourth pixel units PXU1 to PXU4. An operation from 2 H-time to 4 H-time is described in FIGS. 15 to 17 in detail. This is similar to the above-described sensing operation during 1 H-time, and, as a result, the detailed description thereof will not be repeated here.

According to an example embodiment, sensing operations may be simultaneously performed by pixel groups connected to two different column lines. As a result, the processing time span of the correlated double sampling circuit 140 (refer to FIG. 2) and the analog digital converting circuit 150 may be reduced by more reducing idle times. Additionally, a summation value (or mean value) of voltages sensed by a plurality of pixels through the binning operation may be outputted, and thus the number of occurrences of processing a sense voltage by a correlated double sampler and an analog digital converter may be reduced. As a result, the power-consumption of an image sensor may be reduced.

Figure 18:
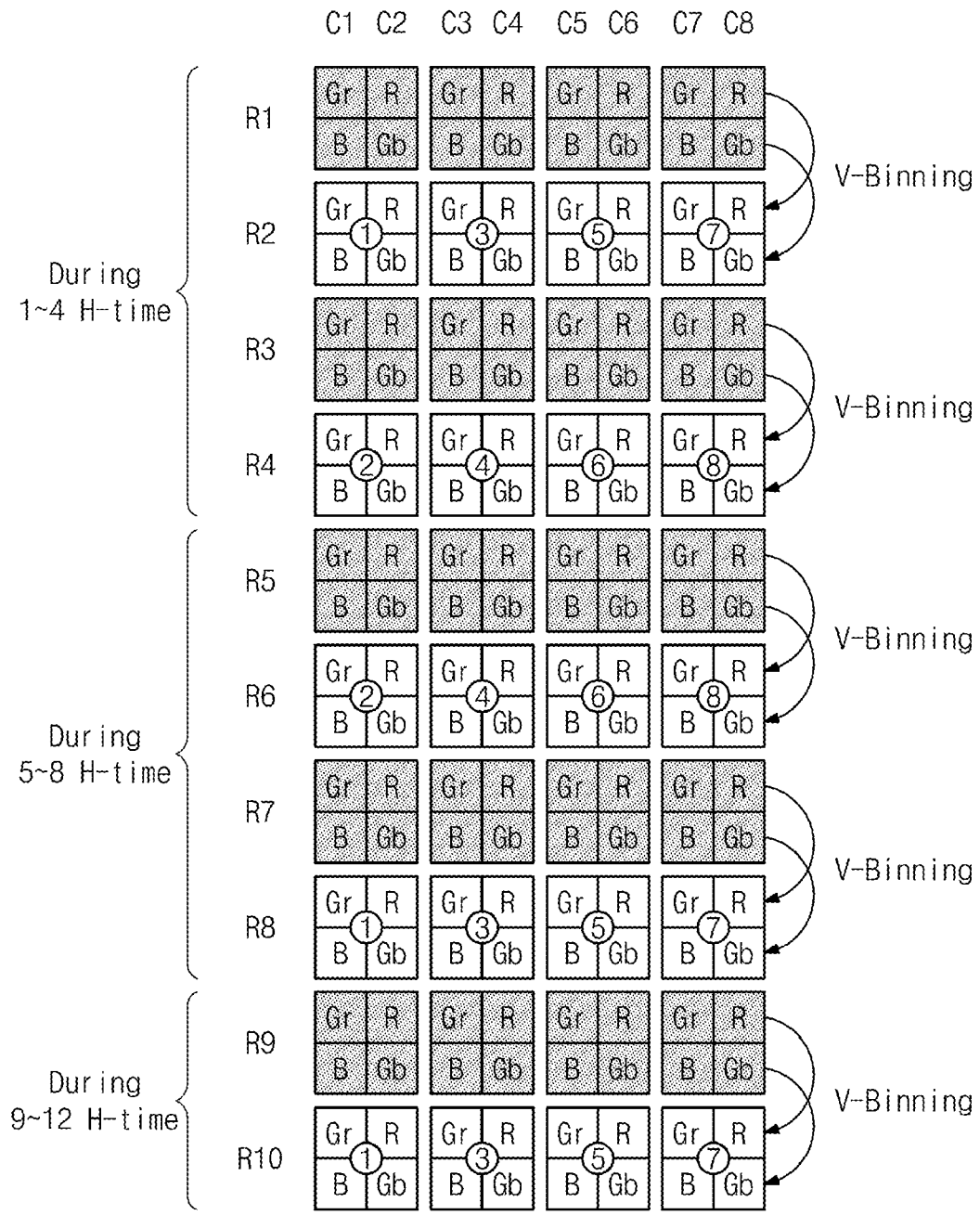
FIG. 18 is a conceptual diagram illustrating an active pixel sensor array driven according to an embodiment described through FIGS. 13 to 17.

FIG. 18 is a conceptual diagram illustrating an active pixel sensor array driven according to an example embodiment described in the discussion related to FIGS. 13 to 17. Pixels attached to one another in units of four may constitute one pixel unit (PXU). Moreover, a digit indicated at the center of a pixel unit may be the number of a column line to which a voltage sensed by a pixel is outputted.

In operation, during 1 H-time (also referred to herein as a first horizontal time period), a sensing operation by pixels Gr of pixel units respectively connected to rows R1 to R10 may be performed. For example, a sensing operation by the pixels connected to the row R2 and a sensing operation by the pixels connected to the row R4 may simultaneously be performed. As illustrated in FIG. 18, a voltage sensed by the pixel Gr connected to the row R2 and the column C1 may be outputted through the first column line ①, and a voltage sensed by the pixel Gr connected to the row R4 and the column C1 may be outputted through the second column line ②. Sense voltages outputted through the first and second column lines ① and ② may be respectively processed by two different correlated double samplers and two different analog-to-digital converters.

In example embodiments, a binning operation (i.e., vertical binning) may be performed with respect to the pixels connected to two rows (e.g., R1 and R2) that are adjacent to each other. This is indicated by the shaded areas and arrows in FIG. 18. For example, a value (or a mean value) obtained by summing voltages sensed by the pixel Gr connected to the row R1 and the column C1 and the pixel Gr connected to the row R2 and the column C1 may be outputted through the first column line CL1 (refer to FIG. 2).

From 2 H-time to 4 H-time (also referred to herein as from horizontal time period 2H through horizontal time period 4H), operations similar to the operations during 1 H-time may be performed. That is, a voltage sensed by the pixel unit connected to the row R2 and a voltage sensed by the pixel unit connected to the row R4 may be respectively outputted through the first column line ① and the second column line ②. Operations similar thereto may be performed with respect to the pixel units connected to the column C3 to C8.

Sensing operations may be simultaneously performed by the pixel groups connected to two different column lines based on the operating method, thereby improving the operating speed of an image sensor. By operating in parallel in this fashion a system and method in accordance with principles of inventive concepts may accelerate the operation of an image sensor in accordance with principles of inventive concepts.

Figure 19:
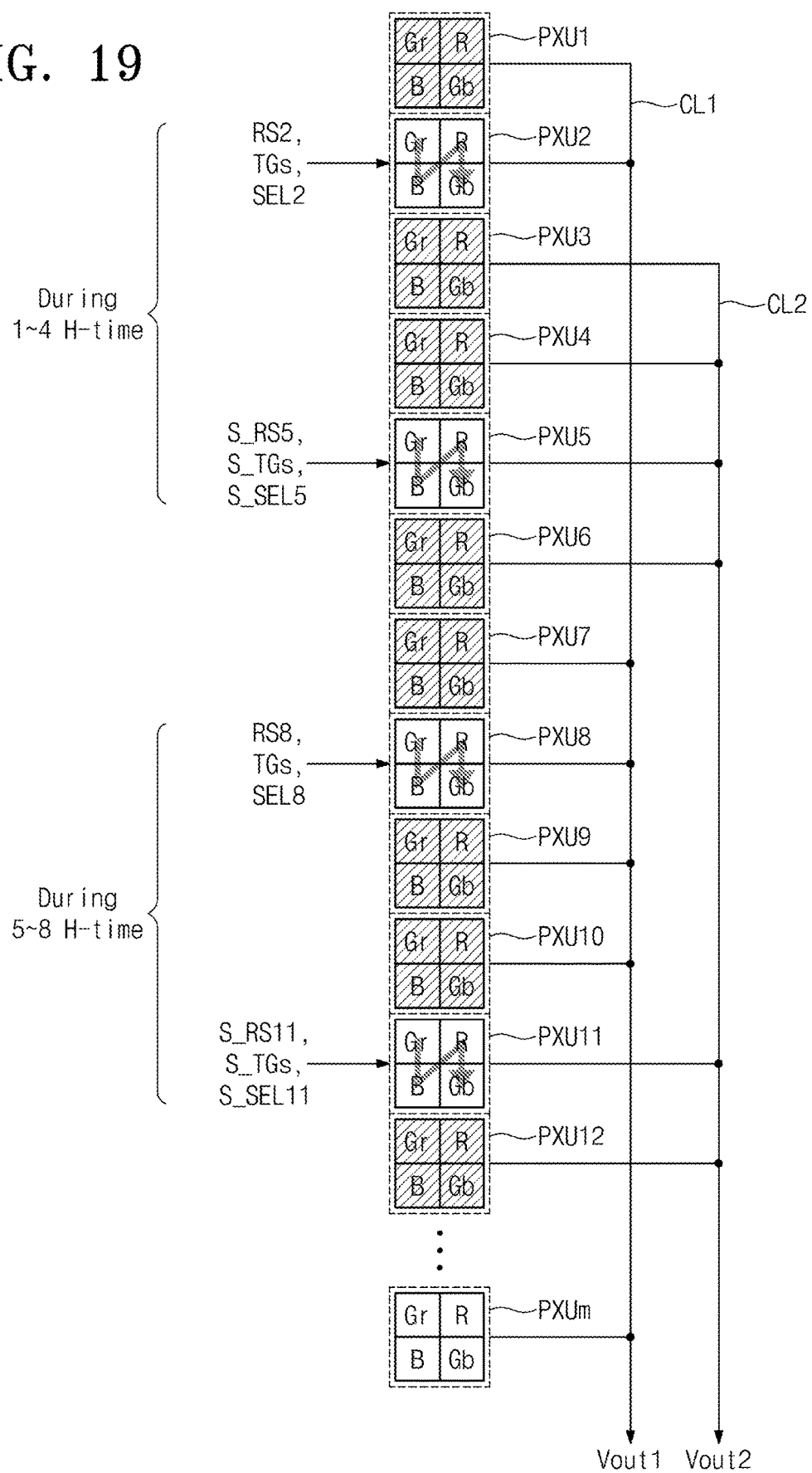
FIG. 19 is a conceptual diagram illustrating an operating method of an image sensor according to an embodiment of the inventive concept.

FIG. 19 is a conceptual diagram illustrating an operating method of an image sensor according to an example embodiment in accordance with principles of inventive concepts. In this example embodiment, a sub-sampling mode will be described. The sub-sampling mode may refer to performing a sensing operation through only a subset of all the pixels of an active pixel sensor array.

Referring to FIG. 19, a method in which the column lines CL1 and CL2 are connected to the pixel units PXU1 to PXUm may be the same as described above. That is, the pixel units PXU1 and PXU2 may be connected to the first column line CL1, and the pixel units PXU3 to PXUm may be alternately connected to different column lines by four pixel units. A hatched area in FIG. 19 may indicate a pixel unit upon which a sensing operation is not performed. The transmission signals TGs inputted to the pixel unit (PXU) may include the transmission signals TG1 to TG4 (refer to FIG. 3) for driving each of pixels constituting the pixel unit (PXU).

During 1 H-time (also referred to herein as a first horizontal time period 1H), a sensing operation may be performed by the pixel Gr of the second pixel unit PXU2. A sensing operation may be performed according to the selection signal SEL2, the reset signal RS2, and the transmission signal TG1 received from the row decoder 120 (refer to FIG. 1). The voltage Vout1 sensed by the pixel Gr of the second pixel unit PXU2 may be outputted through the first column line CL1.

At the same time, a sensing operation may be performed by the pixel Gr of the fifth pixel unit PXU5. A sensing operation may be performed according to the selection signal SEL5, the reset signal RS5, and the transmission signal TG1 received from the row decoder 120. The voltage Vout2 sensed by the pixel Gr of the fifth pixel unit PXU5 may be outputted through the second column line CL2.

Afterwards, from 2 H-time to 4 H-time and from 5 H-time to 8 H-time (also referred to herein as from a second 2H through fourth 4H and from a fifth 5H through eighth 8H horizontal time period), the operation similar thereto may be performed. The sensing operations are simultaneously performed by two pixel units respectively connected to different column lines from each other may be similar to above-described embodiments. A sub-sampling mode in accordance with principles of inventive concepts may be used in an environment in which a rapid sensing speed or reduced power consumption is required.

Figure 20:
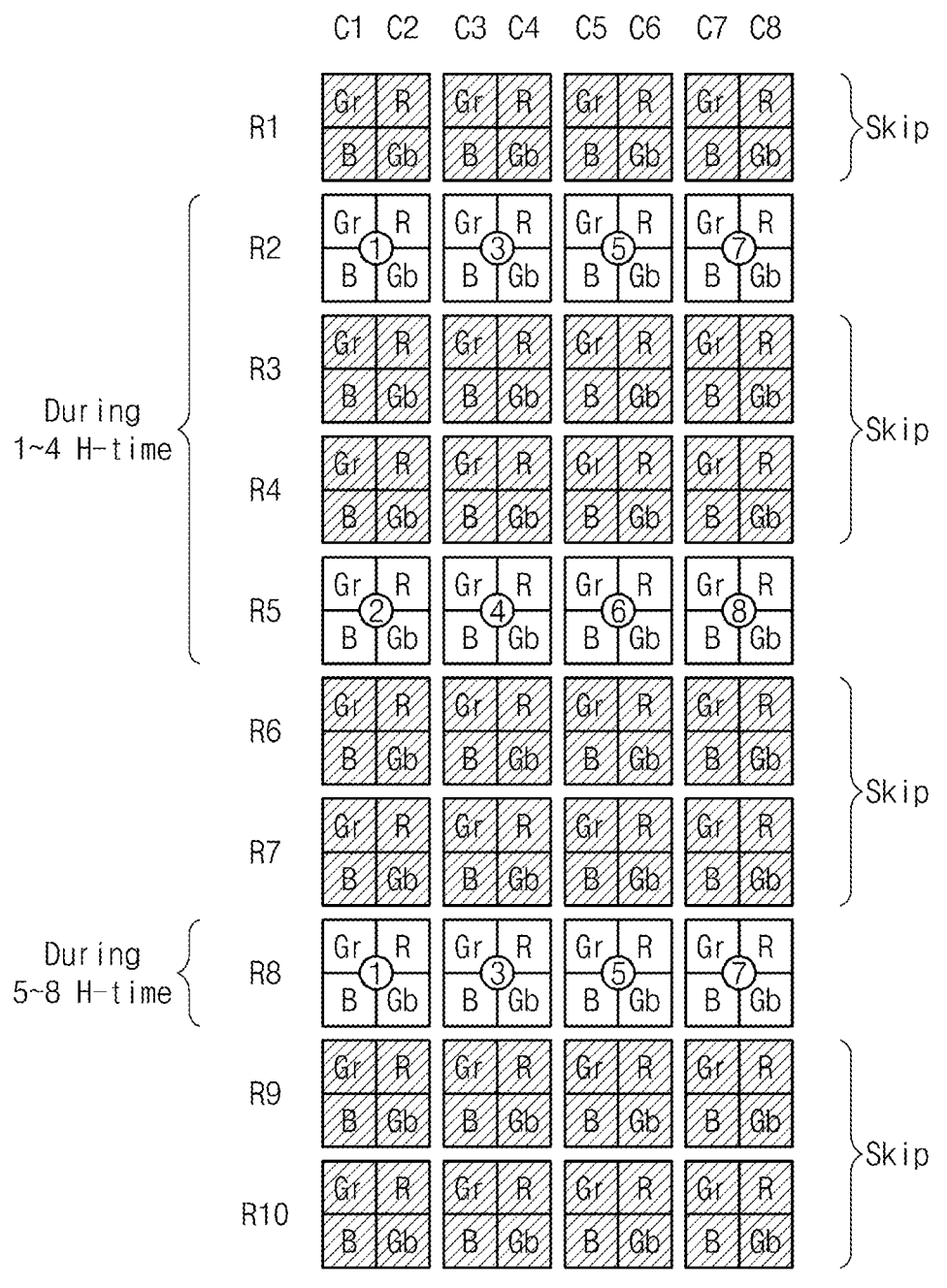

FIG. 20 is a conceptual diagram illustrating an active pixel sensor array driven according to an example embodiment such as that described in relation to FIG. 19. Pixels attached to one another in units of four may constitute one pixel unit. In this example embodiment a digit displayed at the center of a pixel unit may be the number of a column line to which a voltage sensed by a pixel is outputted. A hatched area (i.e., skip) in FIG. 20 may indicate a pixel unit upon which a sensing operation is not performed.

During 1 H-time, a first horizontal time period 1H, sensing operations by pixels Gr of pixel units respectively connected to the rows R2 and R5 may be performed. A sensing operation by the pixels connected to the row R2 and a sensing operation by the pixels connected to the row R5 may be simultaneously performed in accordance with principles of inventive concepts. As illustrated in FIG. 20, a voltage sensed by the pixel Gr connected to the row R2 and the column C1 may be outputted through the first column line ①, and a voltage sensed by the pixel Gr connected to the row R5 and the column C1 may be outputted through the second column line ②. Sense voltages outputted through the first and second column lines ① and ② may be respectively processed by two different correlated double samplers and two different analog-to-digital converters.

From 2 H-time to 4 H-time, from a second 2H through a fourth 4H horizontal time period, an operation similar to the operation during 1 H-time, a first horizontal time period 1H, may be performed. That is, a voltage sensed by the pixel unit connected to the row R2 and a voltage sensed by the pixel unit connected to the row R5 may be respectively outputted through the first column line ① and the second column line ②. Operations similar thereto may be performed with respect to the pixel units connected to the column C3 to C8. Sensing operations may be simultaneously performed by the pixel groups connected to two different column lines, thereby improving the operating speed of an image sensor.

Figure 21:
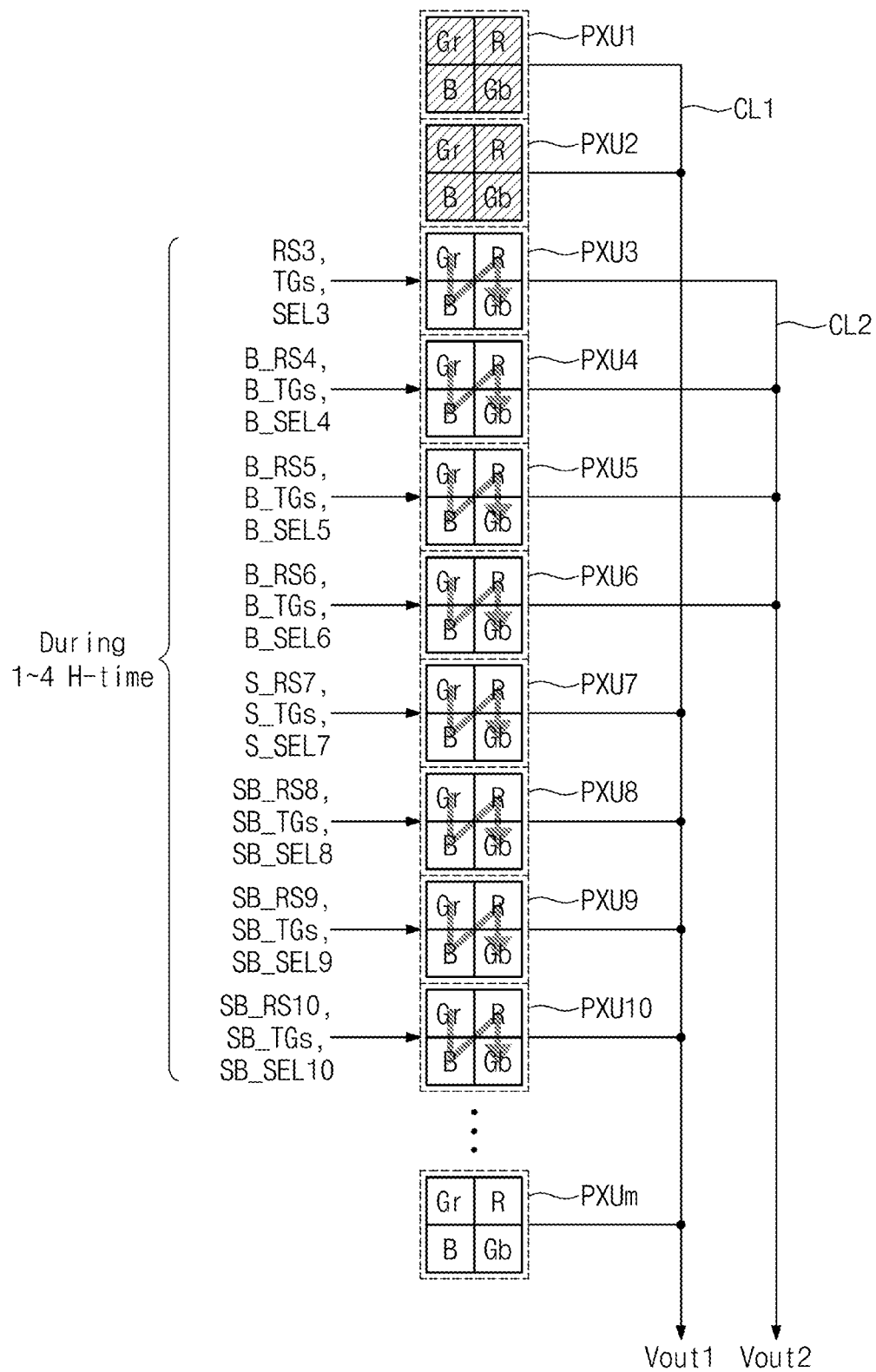
FIG. 21 is a block diagram illustrating an operating method of an image sensor according to an embodiment of the inventive concept.

FIG. 21 is a block diagram illustrating an example embodiment of an operating method of an image sensor in accordance with principles of inventive concepts. According to an example embodiment, 4-binning mode in which a value (or mean value) obtained by summing outputs of the same type of four pixels is outputted as a sense voltage will be described. For example, the pixel units PXU1 to PXUm connected to the multiplexer MUX1 of FIG. 2 is described below. The transmission signals TGs illustrated in FIG. 21 may include the transmission signals TG1 to TG4 for driving four pixels included in one pixel unit (PXU).

During 1 H-time, a first horizontal time period 1H, sensing operations may be performed by the pixels Gr of the third to tenth pixel units PXU3 to PXU10. Sensing operations by the pixels Gr of the third to sixth pixel units PXU3 to PXU6 may be performed according to selection signals SEL3, B_SEL4, B_SEL5, and B_SEL6, reset signals RS3, B_RS4, B_RS5, and B_RS6, and the transmission signal TG1 received from the row decoder 120 (refer to FIG. 1). The voltage Vout1 sensed by the third to sixth pixel units PXU3 to PXU6 may be outputted through the first column line CL1.

At the same time, sensing operations by the pixels Gr of the seventh to tenth pixel units PXU7 to PXU10 may be performed according to selection signals S_SEL7, SB_SEL8, SB_SEL9, and SB_SEL10, reset signals S_RS7, SB_RS8, SB_RS9, and SB_RS10, and the transmission signal TG1 received from the row decoder 120. The voltage Vout2 sensed by the seventh to tenth pixel units PXU7 to PXU10 may be outputted through the second column line CL2.

An operation performed from 2 H-time to 4 H-time, from a second horizontal time period 2H through a fourth horizontal time period 4H, is similar to the operation performed during 1 H-time, the first horizontal time period 1H, and thus the detailed description thereof will not be repeated here.

According to an example embodiment in accordance with principles of inventive concepts, a binning operation is performed with respect to four pixels, unlike the example embodiment described in in the discussion related to FIG. 13. The example 4-binning mode may be used in an environment in which rapid sensing or reduced power consumption is required of an image sensor.

Figure 22:
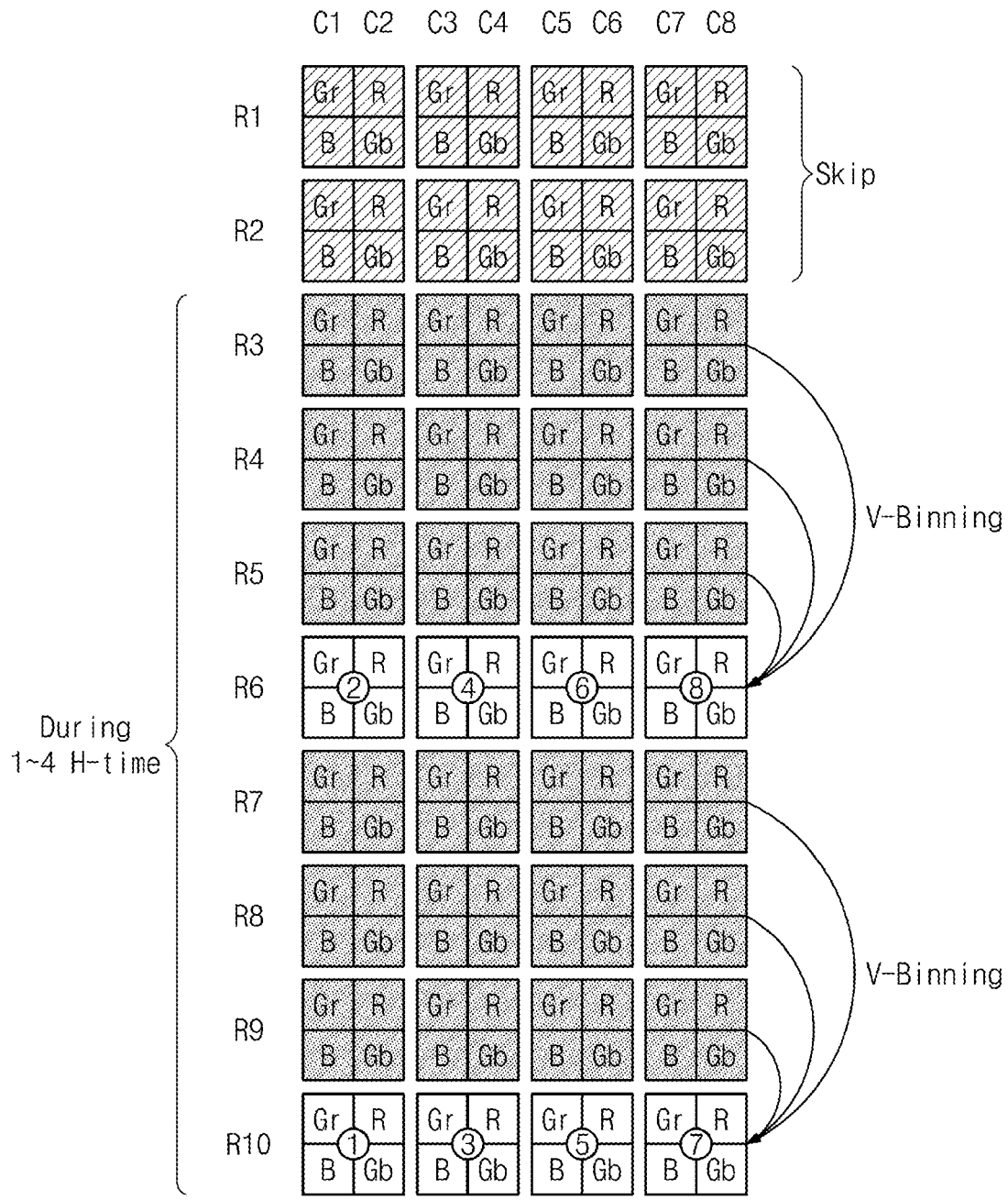
FIG. 22 is a conceptual diagram illustrating an active pixel sensor array driven according to an embodiment described in FIG. 20.

FIG. 22 is a conceptual diagram illustrating an active pixel sensor array driven according to an example embodiment described in the discussion related to FIG. 20. Pixels attached to one another in units of four may constitute one pixel unit. A digit displayed at the center of a pixel unit may be the number of a column line to which a voltage sensed by a pixel is outputted. A hatched area (i.e., skip) in FIG. 22 may indicate a pixel unit upon which a sensing operation is not performed. An area illustrated with the shade and an arrow in FIG. 22 may indicate that a binning operation (i.e., vertical binning) is performed with respect to pixels connected to four rows (e.g., rows R3 to R6) adjacent to one another.

During 1 H-time, first horizontal time period 1H, sensing operations by pixels Gr of pixel units respectively connected to the rows R3 to R10 may be performed. The voltage Vout2 sensed by the pixel Gr of each of a pixel unit connected to the row R3 and the column C1, a pixel unit connected to the row R4 and the column C1, a pixel unit connected to the row R5 and the column C1, and a pixel unit connected to the row R6 and the column C1 may be outputted through the second column line ②. The voltage Vout1 sensed by the pixel Gr of each of a pixel unit connected to the row R7 and the column C1, a pixel unit connected to the row R8 and the column C1, a pixel unit connected to the row R9 and the column C1, and a pixel unit connected to the row R10 and the column C1 may be outputted through the second column line ①. The sense voltages Vout1 and Vout2 simultaneously outputted may be respectively processed by two different correlated double samplers and two different analog-to-digital converters.

From 2 H-time to 4 H-time, from the second horizontal time period through the fourth horizontal time period, an operation similar to the operation during 1 H-time, the first horizontal time period, may be performed. That is, voltages sensed by the pixel units connected to the rows R3 to R6 and voltages sensed by the pixel units connected to the rows R7 to R10 may be respectively outputted through the first column line ① and the second column line ②. Operations similar thereto may be performed with respect to the pixel units connected to the column C3 to C8. Sensing operations may be simultaneously performed by the pixel groups connected to two different column lines, thereby improving the operating speed of an image sensor in accordance with principles of inventive concepts.

Figure 23:
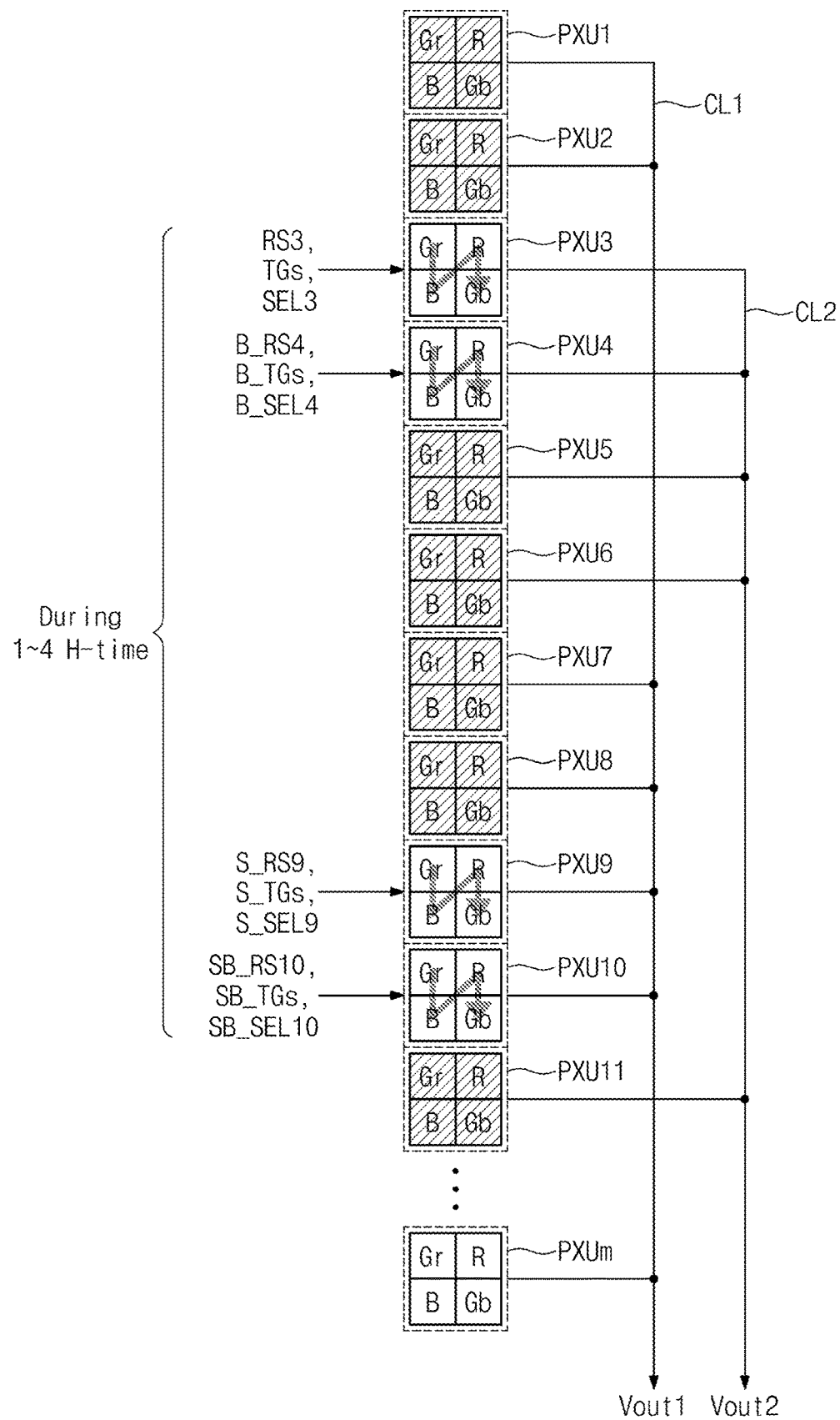
FIG. 23 is a block diagram illustrating an operating method of an image sensor according to an embodiment of the inventive concept.

FIG. 23 is a block diagram illustrating an operating method of an image sensor according to an example embodiment in accordance with principles of inventive concepts. In an example embodiment, a sub-sampling mode will be described. However, unlike the sub-sampling mode described in FIG. 19, 6-*sub*-sampling mode in which sensing operations by two pixel units are performed per 6 pixel units and in which a binning operation (in which a summation value of a sense result is simultaneously outputted) is performed will be described. A hatched area in FIG. 23 may indicate a pixel unit within which a sensing operation is not performed.

During 1 H-time, first horizontal period 1H, a sensing operation may be performed by the pixel Gr of the third pixel unit PXU3. A sensing operation may be performed according to the selection signal SEL3, the reset signal RS3, and the transmission signal TG1 received from the row decoder 120 (refer to FIG. 1). A sensing operation may be performed by the pixel Gr of the fourth pixel unit PXU4. A sensing operation may be performed according to the selection signal SEL4, the reset signal RS4, and the transmission signal TG1 received from the row decoder 120. The voltage Vout2 sensed by the pixel Gr of the third pixel unit PXU3 and the pixel Gr of the fourth pixel unit PXU4 may be outputted through the second column line CL2.

At the same time, a sensing operation may be performed by the pixel Gr of the ninth pixel unit PXU9. A sensing operation may be performed according to the selection signal SEL9, the reset signal RS9, and the transmission signal TG1 received from the row decoder 120. A sensing operation may be performed by the pixel Gr of the tenth pixel unit PXU10. A sensing operation may be performed according to the selection signal SEL10, the reset signal RS10, and the transmission signal TG1 received from the row decoder 120. The voltage Vout1 sensed by the pixel Gr of the ninth pixel unit PXU9 and the pixel Gr of the tenth pixel unit PXU10 may be outputted through the first column line CL1.

Afterwards, from 2 H-time to 4 H-time, second horizontal period 2H through fourth horizontal period 4H, the operation similar to the operation during 1 H-time, first horizontal period 1H, may be performed. That sensing operations are simultaneously performed by two pixel units of two groups respectively connected to different column lines from each other may be similar to above-described embodiments in FIG. 19. However, in an example embodiment in accordance with principles of inventive concepts, a binning operation as well as a sub-sampling may be performed. In such example embodiments a binning operation may be used in an environment in which rapid sensing speed or reduced power consumption by an image sensor is required, for example.

Figure 24:
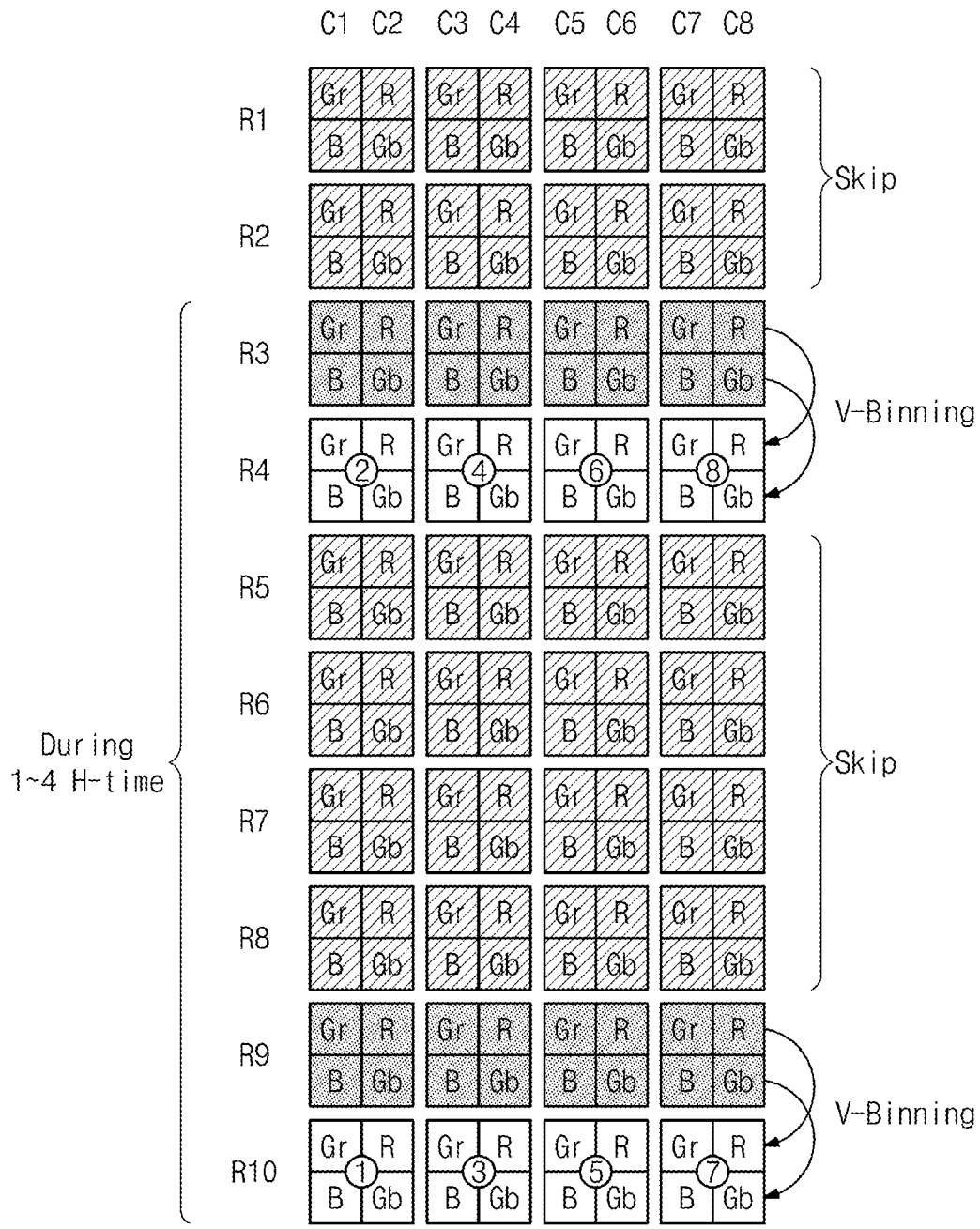
FIG. 24 is a conceptual diagram illustrating an active pixel sensor array driven according to an embodiment described in FIG. 23.

FIG. 24 is a conceptual diagram illustrating an active pixel sensor array driven according to an example embodiment described in the discussion related to FIG. 23. Pixels attached to one another in units of four may constitute one pixel unit. A digit displayed at the center of a pixel unit may be the number of a column line to which a voltage sensed by a pixel is outputted. A hatched area (i.e., skip) in FIG. 24 may indicate a pixel unit within which a sensing operation is not performed. An area illustrated with the shade and an arrow in FIG. 24 may indicate that a binning operation (i.e., vertical binning) is performed with respect to pixels connected to two rows (e.g., rows R3 and R4) adjacent to one another.

During 1 H-time, a first horizontal period 1H, sensing operations by pixels Gr of pixel units respectively connected to the rows R3 and R4 may be performed. The voltage Vout2 sensed by the pixel Gr connected to the row R3 and the column C1 and the pixel Gr connected to the row R4 and the column C1 may be simultaneously outputted through the second column line ②. That is, a binning operation may be performed with respect to pixel units connected to the row R3 and pixel units connected to the row R4.

At the same time, sensing operations by pixels Gr of pixel units respectively connected to the rows R9 and R10 may be performed. The voltage Vout1 sensed by the pixel Gr connected to the row R9 and the column C1 and the pixel Gr connected to the row R10 and the column C1 may be simultaneously outputted through the first column line ①. That is, a binning operation may be performed with respect to pixel units connected to the row R9 and pixel units connected to the row R10.

The sense voltages Vout1 and Vout2 outputted through the first and second column lines ① and ② may be respectively processed by two different correlated double samplers and two different analog-to-digital converters. Afterwards, from 2 H-time to 4 H-time, from the second horizontal period 2H through the fourth horizontal period 4H, an operation similar to the operation during 1 H-time, first horizontal period 1H, may be performed. As such, a sensing operation and a binning operation may be simultaneously performed by the pixel groups connected to two different, thereby improving the operating speed of an image sensor in accordance with principles of inventive concepts.

Figure 25:
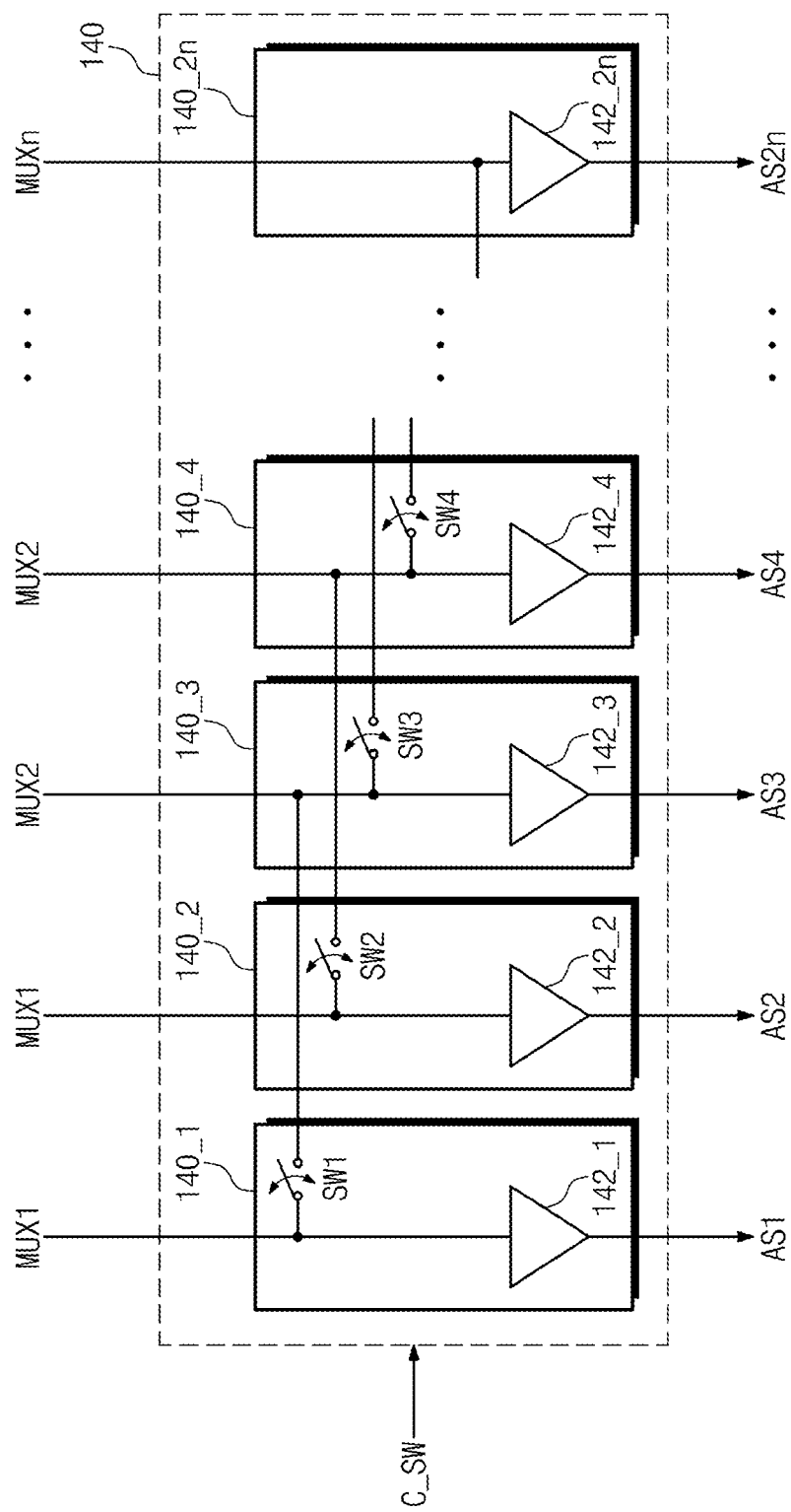
FIG. 25 is a block diagram illustrating a configuration of a correlated double sampling circuit illustrated in FIG. 2.

FIG. 25 is a block diagram illustrating a configuration of an example embodiment of a correlated double sampling circuit, such as correlated double sampling circuit 140 illustrated in FIG. 2. Unlike the above-described vertical binning (in a column direction), the configuration of FIG. 25 will be used to illustrate horizontal binning (in a row direction) in accordance with principles of inventive concepts.

Referring to FIG. 25, the correlated double sampling circuit 140 may include a plurality of correlated double samplers 140_1 to 140_2n. The correlated double samplers 140_1 to 140_2n may include amplifiers 142_1 to 142_2n, respectively. Each correlated double sampler may be connected to another correlated double sampler through a switch. For example, the first correlated double sampler 140_1 may be connected with to third correlated double sampler 140_3 through switch SW1. The switches SW1, SW2, SW3, . . . , etc. may be switched on in the binning mode or switched off in the full mode according to the control signal C_SW received from the timing controller 180 (refer to FIG. 1).

In example embodiments in accordance with principles of inventive concepts correlated double samplers may be connected (for example, using switches SW1, SW2, SW3, etc.) to perform a binning operation with respect to two pixel units adjacent to each other in a row direction. Accordingly, when performing a binning operation with respect to four pixel units adjacent to one another in a row direction, the first correlated double sampler 140_1 may not be connected with the third correlated double sampler 140_3.

In the full mode of operation described in the discussion related to FIG. 4, switches SW1, SW2, SW3, . . . , etc. may be switched off (that is, open). As a result, the sense voltages Vout1 to Vout2n outputted through each of the column lines CL1 to CL2n (refer to FIG. 2) may be respectively inputted to the correlated double samplers 140_1 to 140_2n through the multiplexing circuit 130 and the correlated double samplers 140_1 to 140_2n may output the analog signals AS1 to AS2n, respectively.

Figure 26:
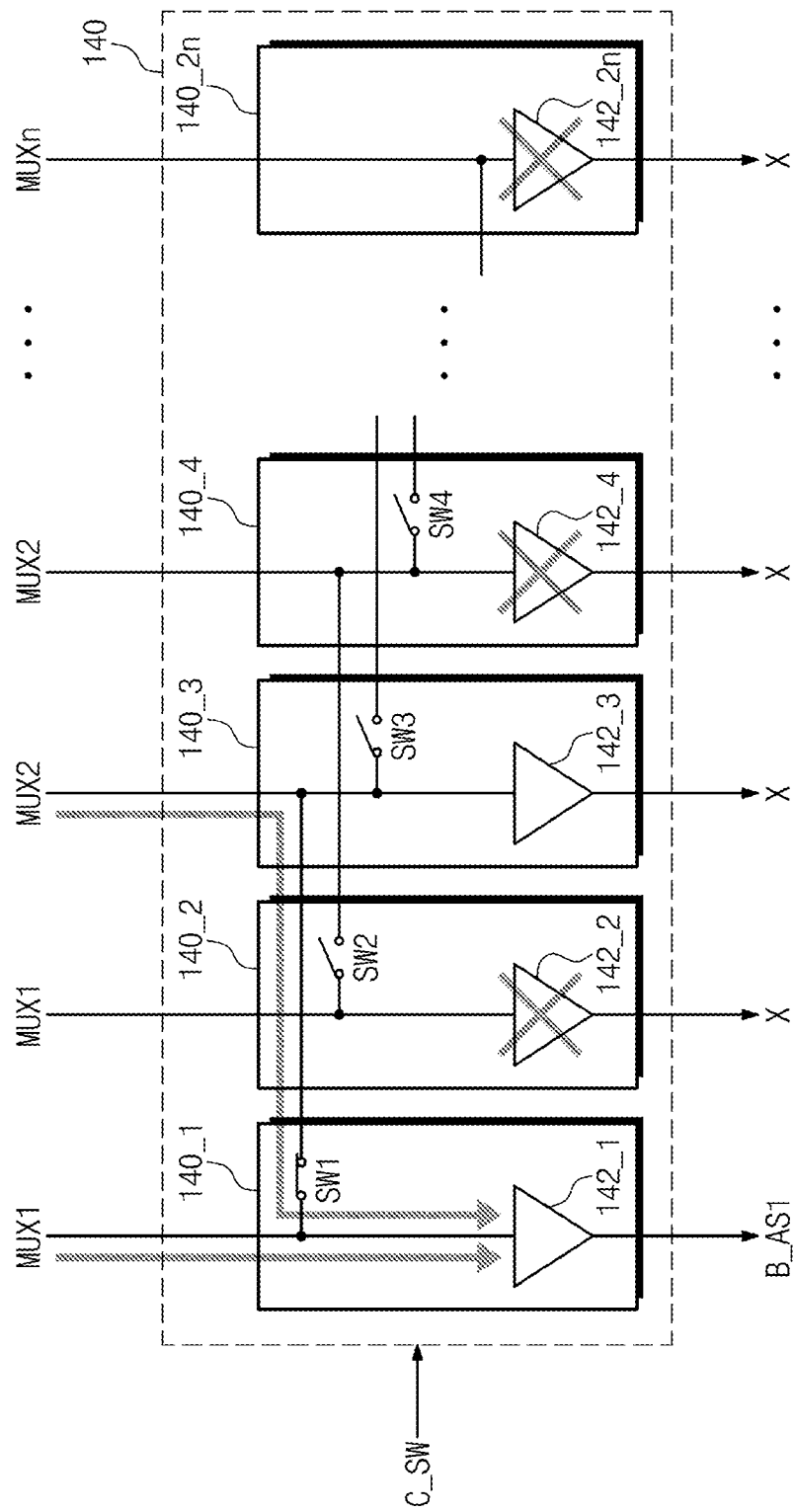
FIG. 26 is a block diagram illustrating a configuration of a correlated double sampling circuit during a binning mode.

FIG. 26 is a block diagram illustrating a configuration of a correlated double sampling circuit 140 during a binning mode (H-binning, or horizontal binning). When the switch SW1 is switched on according to the control signal C_SW from the timing controller 180 (refer to FIG. 2), a sense voltage inputted from the first multiplexer MUX1 to the first correlated double sampler 140_1 and a sense voltage inputted from the second multiplexer MUX2 to the first correlated double sampler 140_1 may be sequentially inputted through the amplifier 142_1. That is, an analog signal B_AS1 outputted from the amplifier 142_1 may be a signal outputted through a binning operation. At this time, other amplifiers may be turned off except the amplifiers 142_1 and 142_3.

The outputted analog signal B_AS1 may be inputted to the first converter ADC1 (refer to FIG. 2) and may be converted into a digital signal. Through such a binning operation, the operating speed of an image sensor may be improved, and power consumption may be reduced.

Figure 27:
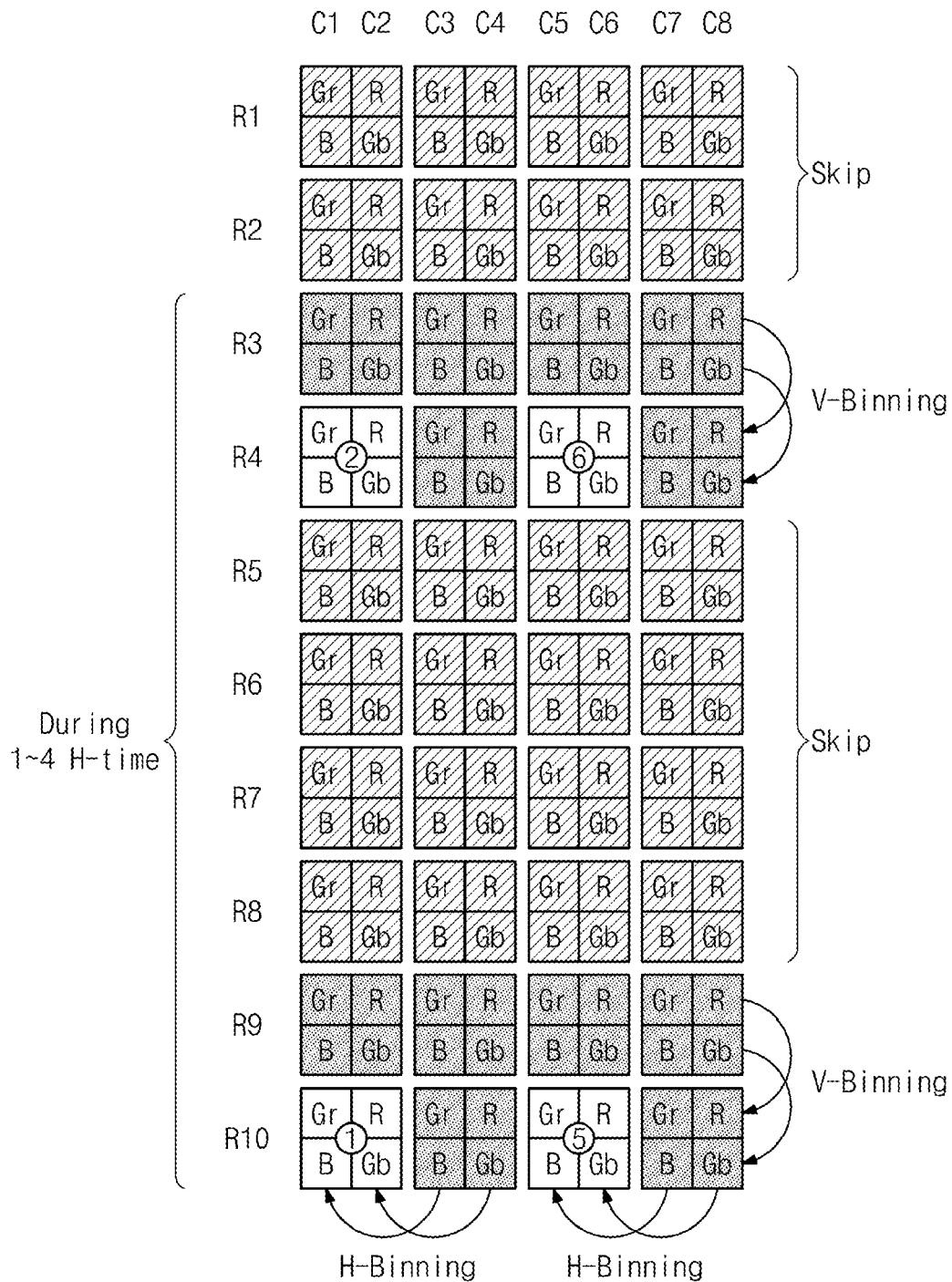
FIG. 27 is a conceptual diagram illustrating an active pixel sensor array driven according to a sub-sampling mode described in FIGS. 23 and 24 and a binning mode described in FIG. 26.

FIG. 27 is a conceptual diagram illustrating an active pixel sensor array driven according to a sub-sampling mode in accordance with principles of inventive concepts, such as that described in the discussion related to FIGS. 23 and 24 and a binning mode described in the discussion related to FIG. 26. Pixels attached, or adjacent, to one another in units of four may constitute one pixel unit. Moreover, a digit displayed at the center of a pixel unit may be the number of a column line to which a voltage sensed by a pixel is outputted. A hatched area (i.e., skip) in FIG. 27 may indicate a pixel unit within which a sensing operation is not performed. An area illustrated with shade and an arrow in FIG. 27 may mean that a binning operation (i.e., vertical binning and horizontal binning) is performed with respect to pixel units adjacent to one another.

An operating method of FIG. 27 may be similar to that of FIG. 24, and a duplicated description will not be presented here. In an example embodiment in accordance with principles of inventive concepts, a binning operation (i.e., H-binning, or horizontal binning) in a row direction may be performed. As described in the discussion related to FIG. 26, when the switch SW1 is switched on (that is, closed) according to the control signal C_SW from the timing controller 180 (refer to FIG. 2), voltages sensed from pixel units connected to the rows C3 and C4 may be inputted to the first correlated double sampler 140_1. The first correlated double sampler 140_1 (refer to FIG. 26) may perform a sampling and holding operation with respect to a voltage sensed from pixel units connected to the rows C3 and C4 as well as a voltage sensed from pixel units connected to the rows C1 and C2. Additionally, the analog signal B_AS1 (refer to FIG. 26) processed by the first correlated double sampler 140_1 may be converted into a digital signal by the first analog digital converter ADC1.

In example embodiments in accordance with principles of inventive concepts, sensing operations may be simultaneously performed by pixel units of two different groups respectively connected to two different column lines. Voltages sensed by pixel units of two different groups may be processed by different correlated double samplers (and different analog digital converters). As a result, the operating speed of an image sensor may be improved. Additionally, the power consumption of an image sensor may be reduced according to various operating modes described herein.

Figure 28:
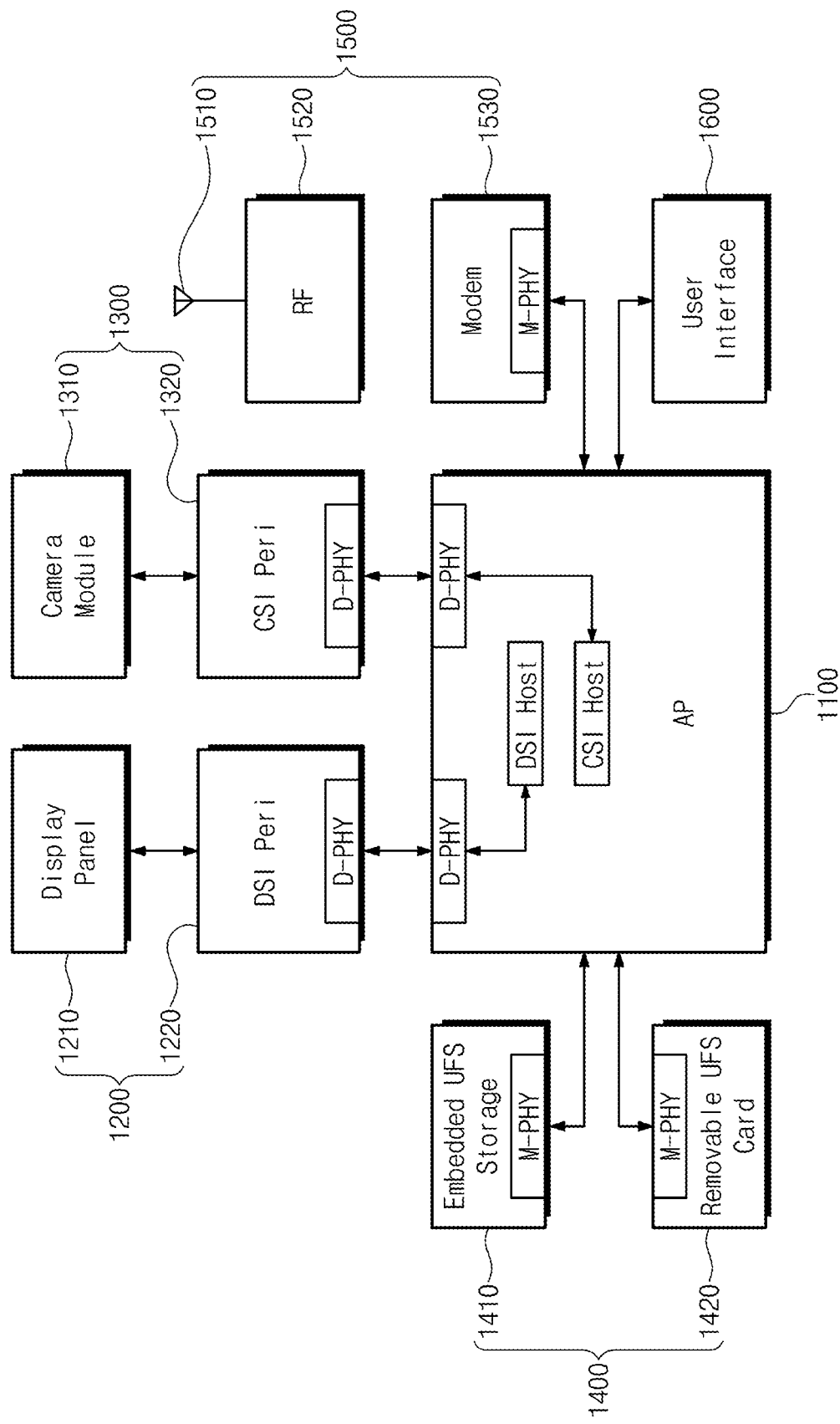
FIG. 28 is a block diagram illustrating a mobile device to which the inventive concept is applied.

FIG. 28 is a block diagram illustrating a mobile device in which inventive concepts are applied. Referring to FIG. 28, a mobile device 1000 may be implemented to support a mobile industry processor interface (MIPI) standard or an embedded DisplayPort (eDP) standard. The mobile device 1000 may include an application processor 1100, a display unit 1200, an image processing unit 1300, data storage 1400, a wireless transceiver unit 1500, and a user interface 1600.

The application processor 1100 may control an overall operation of the mobile device 1000. The application processor 1100 may include a DSI host interfacing with the display unit 1200 and a CSI host interfacing with the image processing unit 1300.

The display unit 1200 may include the display panel 1210 and a display serial interface (DSI) peripheral circuit 1220. The display panel 1210 may display image data. A display serial interface (DSI) host mounted on the application processor 1100 may perform a serial communication with the display panel 1210 through a DSI. The DSI peripheral circuit 1220 may include a timing controller, a source driver, and the like which are required to drive the display panel 1210.

The image processing unit 1300 may include a camera module 1310 and a camera serial interface (CSI) peripheral circuit 1320. The camera module 1310 and the CSI peripheral circuit 1320 may include a lens, and an image sensor. Image data generated from the camera module 1310 may be processed at the image processor 1100, and the processed image may be transmitted to the application processor 5100 through a CSI. The image sensor may support one or more operating modes in accordance with principles of inventive concepts. In example embodiments, a sensing operation may be simultaneously performed by two pixel groups respectively connected to different column lines, thereby improving an operating speed.

The data storage 1400 may include embedded universal flash storage (UFS) storage 1410 and a removable UFS card 1420. The embedded UFS storage 1410 and the removable UFS card 1420 may communicate with the application processor 1100 through M-PHY layer. A host (i.e., application processor 1100) may include a bridge to communicate with the removable UFS card 1420 based on another protocol different from a UFS protocol. The application processor 1100 and the removable UFS card 1420 may communicate with each other through various card protocols (e.g., a universal serial bus (USB) flash drive (UFD), a multimedia card (MMC), an embedded multimedia card (eMMC), a secure digital (SD), a mini SD, a Micro SD) The embedded UFS storage 1410 and the removable UFS card 1420 may be implemented with a three-dimensional non-volatile memory device in which a cell string to which a memory cell is connected is formed to be perpendicular to a substrate, for example.

A wireless transceiver unit 1500 may include an antenna 1510, a radio frequency (RF) unit 1520, and a modulator/demodulator (MODEM) 1530. An embodiment of the inventive concept is exemplified as the modem 1530 communicates with the application processor 1100 through M-PHY layer. However, the scope and spirit of inventive concepts are not limited thereto. For example, the modem 1530 may be included in the application processor 1100.

Although detailed embodiments of inventive concepts have been described, it should be understood that numerous other modifications, changes, variations, and substitutions can be devised by those skilled in the art. Moreover, it should be understood that the inventive concepts cover various techniques which can be readily modified and embodied based on the above-described embodiments.

What is claimed is:

1. An image sensor comprising:
an active pixel sensor array including a first to fourth pixel units arranged in a column direction,
the first and second pixel units being connected to a first column line,
the third and fourth pixel units being connected to a second column line,
each of the first to fourth pixel units including first to fourth pixels,
the second pixel being adjacent to the first pixel in a first direction,
the third pixel being adjacent to the first pixel in a second direction,
the fourth pixel being adjacent to the second and third pixels,
the first to fourth pixels including first to fourth transmission transistors, respectively,
first terminals of respective transmission transistors being connected to first to fourth photoelectric conversion devices, respectively, and
second terminals of respective transmission transistors being connected to a floating diffusion region in common; and a timing controller configured to transmit:
  a first transmission signal to a third terminal of the first transmission transistor of the first pixel unit to turn on the first transmission transistor of the first pixel unit during a first interval,
  a second transmission signal to a third terminal of the second transmission transistor of the first pixel unit to turn on the second transmission transistor of the first pixel unit during a second interval,
  a third transmission signal to a third terminal of the third transmission transistor of the first pixel unit to turn on the third transmission transistor of the first pixel unit during a third interval, and
  a fourth transmission signal to a third terminal of the fourth transmission transistor of the first pixel unit to turn on the fourth transmission transistor of the first pixel unit during a fourth interval.

2. The image sensor of claim 1, wherein the timing controller is further configured to transmit:
  a first transmission signal to a third terminal of the first transmission transistor of the second pixel unit to turn on the first transmission transistor of the second pixel unit during a fifth interval,
  a second transmission signal to a third terminal of the second transmission transistor of the second pixel unit to turn on the second transmission transistor of the second pixel unit during a sixth interval,
  a third transmission signal to a third terminal of the third transmission transistor of the second pixel unit to turn on the third transmission transistor of the second pixel unit during a seventh interval, and
  a fourth transmission signal to a third terminal of the fourth transmission transistor of the second pixel unit to turn on the fourth transmission transistor of the second pixel unit during a eighth interval.

3. The image sensor of claim 2, wherein the timing controller is further configured to transmit:
  a first transmission signal to a third terminal of the first transmission transistor of the third pixel unit to turn on the first transmission transistor of the third pixel unit during the first interval,
  a second transmission signal to a third terminal of the second transmission transistor of the third pixel unit to turn on the second transmission transistor of the third pixel unit during the second interval,
  a third transmission signal to a third terminal of the third transmission transistor of the third pixel unit to turn on the third transmission transistor of the third pixel unit during the third interval, and
  a fourth transmission signal to a third terminal of the fourth transmission transistor of the third pixel unit to turn on the fourth transmission transistor of the third pixel unit during the fourth interval.

4. The image sensor of claim 3, wherein the timing controller is further configured to transmit:
  a first transmission signal to a third terminal of the first transmission transistor of the fourth pixel unit to turn on the first transmission transistor of the fourth pixel unit during the fifth interval,
  a second transmission signal to a third terminal of the second transmission transistor of the fourth pixel unit to turn on the second transmission transistor of the fourth pixel unit during the sixth interval,
  a third transmission signal to a third terminal of the third transmission transistor of the fourth pixel unit to turn on the third transmission transistor of the fourth pixel unit during the seventh interval, and
  a fourth transmission signal to a third terminal of the fourth transmission transistor of the fourth pixel unit to turn on the fourth transmission transistor of the fourth pixel unit during the eighth interval.

5. The image sensor of claim 1, wherein the timing controller is further configured to transmit:
  a first transmission signal to a third terminal of the first transmission transistor of the second pixel unit to turn on the first transmission transistor of the second pixel unit during the first interval,
  a second transmission signal to a third terminal of the second transmission transistor of the second pixel unit to turn on the second transmission transistor of the second pixel unit during the second interval,
  a third transmission signal to a third terminal of the third transmission transistor of the second pixel unit to turn on the third transmission transistor of the second pixel unit during the third interval, and
  a fourth transmission signal to a third terminal of the fourth transmission transistor of the second pixel unit to turn on the fourth transmission transistor of the second pixel unit during the fourth interval.

6. The image sensor of claim 5, wherein the timing controller is further configured to transmit:
  a first transmission signal to a third terminal of the first transmission transistor of the third pixel unit to turn on the first transmission transistor of the third pixel unit during the first interval,
  a second transmission signal to a third terminal of the second transmission transistor of the third pixel unit to turn on the second transmission transistor of the third pixel unit during the second interval,
  a third transmission signal to a third terminal of the third transmission transistor of the third pixel unit to turn on the third transmission transistor of the third pixel unit during the third interval, and
  a fourth transmission signal to a third terminal of the fourth transmission transistor of the third pixel unit to turn on the fourth transmission transistor of the third pixel unit during the fourth interval.

7. The image sensor of claim 6, wherein the timing controller is further configured to transmit:
  a first transmission signal to a third terminal of the first transmission transistor of the fourth pixel unit to turn on the first transmission transistor of the fourth pixel unit during the first interval,
  a second transmission signal to a third terminal of the second transmission transistor of the fourth pixel unit to turn on the second transmission transistor of the fourth pixel unit during the second interval,
  a third transmission signal to a third terminal of the third transmission transistor of the fourth pixel unit to turn on the third transmission transistor of the fourth pixel unit during the third interval, and
  a fourth transmission signal to a third terminal of the fourth transmission transistor of the fourth pixel unit to turn on the fourth transmission transistor of the fourth pixel unit during the fourth interval.

8. The image sensor of claim 1, further comprising:
  a row decoder configured to select a row of the active pixel sensor array;
  a first correlated double sampler configured to convert a first sense voltage sensed from a selected pixel of a first pixel group including the first and second pixel units into a first correlated double sampling signal, the selected pixel of the first pixel group being connected to the selected row; and a second correlated double sampler configured to convert a second sense voltage sensed from a selected pixel of a second pixel group including the third and fourth pixel units into a second correlated double sampling signal, the selected pixel of the second pixel group being connected to the selected row.

9. The image sensor of claim 8, further comprising:
a first analog-to-digital converter configured to convert the first correlated double sampling signal outputted from the first correlated double sampler into a first digital signal; and
a second analog-to-digital converter configured to convert the second correlated double sampling signal outputted from the second correlated double sampler into a second digital signal.

10. The image sensor of claim 8, further comprising:
a multiplexer configured to connect the first column line to one of the first and second correlated double samplers and to connect the second column line to the other of the first and second correlated double samplers.

11. The image sensor of claim 1, wherein each of the first and second pixel units further comprise:
a reset transistor of which a first terminal is connected to the floating diffusion region, a second terminal is connected to a supply voltage, and a third terminal is configured to receive a reset voltage; and
a drive transistor of which a first terminal is connected to the first column line through a select transistor, a second terminal is connected to the supply voltage, and a third terminal is connected to the floating diffusion region.

12. The image sensor of claim 11, wherein each of the third and fourth pixel units further comprising:
a reset transistor of which a first terminal is connected to the floating diffusion region, a second terminal is connected to a supply voltage, and a third terminal is configured to receive a reset voltage; and
a drive transistor of which a first terminal is connected to the second column line through a select transistor, a second terminal is connected to the supply voltage, and a third terminal is connected to the floating diffusion region.

13. The image sensor of claim 11, wherein the timing controller is further configured to transmit:
a select signal to the select transistor of each of the first to fourth pixel units to select a corresponding selection transistor; and
a reset signal to the reset transistor of each of the first to fourth pixel units to reset a corresponding reset transistor.

14. An image sensor comprising:
an active pixel sensor array including a first to fourth pixel units arranged in a column direction,
the first and second pixel units being connected to a first column line,
the third and fourth pixel units being connected to a second column line,
each of the first to fourth pixel units including first to fourth pixels,
the second pixel being adjacent to the first pixel in a first direction,
the third pixel being adjacent to the first pixel in a second direction,
the fourth pixel being adjacent to the second and third pixels,
the first to fourth pixels including first to fourth transmission transistors, respectively,
first terminals of respective transmission transistors being connected to first to fourth photoelectric conversion devices, respectively, and
second terminals of respective transmission transistors being connected to a floating diffusion region in common; and
a timing controller configured to transmit:
a first transmission signal to a third terminal of the first transmission transistor of the first pixel unit during a first interval,
a second transmission signal to a third terminal of the second transmission transistor of the first pixel unit during a second interval,
a third transmission signal to a third terminal of the third transmission transistor of the first pixel unit during a third interval,
a fourth transmission signal to a third terminal of the fourth transmission transistor of the first pixel unit during a fourth interval,
a first transmission signal to a third terminal of the first transmission transistor of the third pixel unit during the first interval,
a second transmission signal to a third terminal of the second transmission transistor of the third pixel unit during the second interval,
a third transmission signal to a third terminal of the third transmission transistor of the third pixel unit during the third interval, and
a fourth transmission signal to a third terminal of the fourth transmission transistor of the third pixel unit during the fourth interval.

15. The image sensor of claim 14, wherein the timing controller is further configured to transmit:
a first transmission signal to a third terminal of the first transmission transistor of the second pixel unit during a fifth interval,
a second transmission signal to a third terminal of the second transmission transistor of the second pixel unit during a sixth interval,
a third transmission signal to a third terminal of the third transmission transistor of the second pixel unit during a seventh interval,
a fourth transmission signal to a third terminal of the fourth transmission transistor of the second pixel unit during a eighth interval.

16. The image sensor of claim 14, wherein the timing controller is further configured to transmit:
a first transmission signal to a third terminal of the first transmission transistor of the second pixel unit during the first interval,
a second transmission signal to a third terminal of the second transmission transistor of the second pixel unit during the second interval,
a third transmission signal to a third terminal of the third transmission transistor of the second pixel unit during the third interval,
a fourth transmission signal to a third terminal of the fourth transmission transistor of the second pixel unit during the fourth interval.

17. The image sensor of claim 14, further comprising:
a row decoder configured to select a row of the active pixel sensor array;
a first correlated double sampler configured to convert a first sense voltage sensed from a selected pixel of a first pixel group including the first and second pixel units into a first correlated double sampling signal, the selected pixel of the first pixel group being connected to the selected row; and a second correlated double sampler configured to convert a second sense voltage sensed from a selected pixel of a second pixel group including the third and fourth pixel units into a second correlated double sampling signal, the selected pixel of the second pixel group being connected to the selected row.

18. The image sensor of claim 17, further comprising:
a first analog-to-digital converter configured to convert the first correlated double sampling signal outputted from the first correlated double sampler into a first digital signal; and
a second analog-to-digital converter configured to convert the second correlated double sampling signal outputted from the second correlated double sampler into a second digital signal.

19. The image sensor of claim 17, further comprising:
a multiplexer configured to connect the first column line to one of the first and second correlated double samplers and to connect the second column line to the other of the first and second correlated double samplers.

20. The image sensor of claim 14, wherein each of the first and second pixel units further comprise:
a reset transistor of which a first terminal is connected to the floating diffusion region, a second terminal is connected to a supply voltage, and a third terminal is configured to receive a reset voltage; and
a drive transistor of which a first terminal is connected to the first column line through a select transistor, a second terminal is connected to the supply voltage, and a third terminal is connected to the floating diffusion region.

* * * * *